United States Patent [19]
Osaka et al.

[11] Patent Number: 5,821,767
[45] Date of Patent: Oct. 13, 1998

[54] INFORMATION PROCESSING APPARATUS AND BACKBOARD HAVING ON BACKBOARD SIDE MATCHING RESISTORS SUITED TO MODULES CONNECTED THERETO

[75] Inventors: Hideki Osaka, Hiratsuka; Yukihiro Seki, Yokohama; Shigemi Adachi, Seto, all of Japan

[73] Assignee: Hitachi, Ltd., Tokyo, Japan

[21] Appl. No.: 633,309

[22] Filed: Apr. 15, 1996

[30] Foreign Application Priority Data

Apr. 17, 1995 [JP] Japan ................................. 7-090708

[51] Int. Cl.$^6$ ...................... H03K 17/16; H03K 19/0175
[52] U.S. Cl. .................................. 326/30; 326/86; 326/80; 326/33
[58] Field of Search ................................ 326/30, 33, 81, 326/80, 86; 327/404, 321; 361/782, 766

[56] References Cited

U.S. PATENT DOCUMENTS

| | | | |
|---|---|---|---|
| 3,694,655 | 9/1972 | Belluche | 326/30 |
| 3,832,575 | 8/1974 | Dasgupta et al. | 326/30 |
| 5,003,467 | 3/1991 | Donaldson et al. | 326/30 |
| 5,105,340 | 4/1992 | Lawrence | 361/782 |
| 5,534,801 | 7/1996 | Wu et al. | 326/81 |
| 5,627,481 | 5/1997 | Takekuma et al. | 326/30 |

*Primary Examiner*—Edward P. Westin
*Assistant Examiner*—Richard Roseen
*Attorney, Agent, or Firm*—Antonelli, Terry, Stout & Kraus, LLP

[57] ABSTRACT

In an information processing apparatus including a backboard having a bus for transmitting signals therethrough, at least one module, and a connector to connect the bus to the module, the backboard includes two terminators disposed respectively at both ends of the bus for providing matched termination according to a characteristic impedance of the bus to which the module is connected and a matching resistor disposed between the bus and the module. The matching resistor has a resistance value Rm represented as $$Rm = Z1 \cdot k - Z0/2 \, (0.8 < k < 1.3)$$

where, $Z1$ indicates a characteristic impedance of the module, $Z0$ denotes the characteristic impedance of the bus, and $k$ stands for a coefficient.

18 Claims, 20 Drawing Sheets

LOW-AMPLITUDE INTERFACE

OPEN-DRAIN DRIVER+ COMPARATOR RECEIVER

PUSH-PULL DRIVER+ COMPARATOR DRIVER

INFORMATION PROCESSING APPARATUS AND BACKBOARD HAVING ON BACKBOARD SIDE MATCHING RESISTORS SUITED TO MODULES CONNECTED THERETO

CROSS-REFERENCE TO RELATED APPLICATION

The present application relates to subject matters described in application Ser. No. 476,576 filed on Jun. 7, 1995 entitled "SIGNAL TRANSMITTING DEVICE, CIRCUIT BLOCK AND INTEGRATED CIRCUIT SUITED TO FAST SIGNAL TRANSMISSION" which is a continuation application of Ser. No. 269,352 and the application of Ser. No. 269,352 filed on Jun. 30, 1994 entitled "FAST TRANSMISSION LINE IMPLEMENTED WITH RECEIVER, TERMINATOR AND IC ARRANGEMENTS" to which a Notice of Allowability was issued on Nov. 28, 1995. The disclosures of the applications of Ser. No. 476,576 and Ser. No. 269,352 are hereby incorporated by reference.

BACKGROUND OF THE INVENTION

The present invention relates to an information processing apparatus in which signals are transmitted via a bus between such constituent elements as central processing units (CPUs), memories, and the like as digital circuits including complementary metal-oxide semiconductors (CMOSs) or functional blocks including such digital circuits. In particular, the present invention relates to an information processing apparatus in which the signal transmission is transmitted at a high speed via a plurality of modules connected to one bus line.

To cope with an increase in the transmission speed of signals between digital circuits including devices of semiconductor integrated circuits (SIC), there has been developed a technology related to a low-amplitude interface to transmit signals with a low amplitude of about one volt or less.

Especially, due to such an increase in the operation speed of semiconductor integrated circuits, the signals have steep edges, namely, the rising and falling speed of signals edges are increased. It is consequently impossible to ignore waveform distortion due to impedance mismatching. To overcome this difficulty, there has been commonly adopted a matched termination arrangement for a bus in which the bus is terminated with an impedance of a line thereof.

Data output drivers of low-amplitude interface primarily include open-drain and push-pull drivers. Representatives thereof are a GTL interface and a center tapped termination (CTT) interface, respectively. Data input receivers of such low-amplitude interfaces generally includes a comparator to compare the input signal voltage with a reference voltage (Vref).

FIGS. 1A to 1C show constitution of the input/output interfaces.

FIG. 1A shows an example of a general bus interface circuit including a driver 20 having EBABLE signal 20e and a comparator-type input receiver 30. This configuration generally provides a bus interface as follows. An output line of the driver 20 and one of the input to the receive 30 are connected to a bus. The other input to the receiver 30 is linked with a reference voltage Vref 60.

When outputting data via the interface to the bus, the EBABLE signal 20e is asserted to a low level "L" before transmitting data to the bus. When data is not desired to be sent thereto, the ENABLE signal 20e is negated to a high level "H". In this situation, the output impedance of the driver 20 is set to a state of high impedance (to be called Hi.Z).

FIG. 1B shows a bus interface in an open-drain driver such as GTL including a final-stage circuit 20-a and a comparator-type receiver 30-a. The system includes a reference voltage Vref for the receiver 30-a. In the driver of open-drain type, the DATA-OUT and ENABLE signals of FIG. 1A can be attained by turning a transistor gate of the final stage on and off. That is, the signal from the driver to the bus takes two states including "L" and "Hi.Z" states.

When constructing a bus interface using an open-drain driver 20-a, the reference voltage 60-a of the comparator-type receiver 30-a is generally set to a value which is about ¾ that of a bus termination voltage Vtt.

FIG. 1C shows a bus interface of a push-pull driver including a final-stage circuit 20-b and a comparator-type receiver 30-b. In the push-pull driver, a push-pull circuit to output data is connected in series to a MOS switch to set the output signal to the Hi.Z state.

That is, the MOS switch connected in series to the final-stage driver circuit is turned on or off by the ENABLE signal 20e–b so that the bus signal is set to the Hi.Z state. When the switch is on, data can be outputted according to the DATA-OUT signal.

As above, the bus signal from the push-pull driver takes three states including H, L, and HiZ states.

When a push-pull driver 20-b of, for example, a center tapped termination (CTT) module is used to configure a bus system, the reference voltage 60-b of the receiver 30-b is in general set to be equal to the bus termination voltage Vtt.

Low-amplitude interfaces have been described in detail, for example, in pages 269 to 290 of the "Nikkei Electronics", September 27 (No. 591) published from Nikkei BP in 1993.

The stub series terminated transceiver logic (SSTL) interface which is one of the low-amplitude interfaces has been described in detail, for example, in pages 122 to 123 of the "Nikkei Electronics", July 31 (No.641) published from Nikkei BP in 1995.

FIG. 2 shows an example of the general bus wiring configuration in which a reference numeral 0 indicates a printed circuit board called "backboard" including connectors 41 to 44 on which modules 1 to 4 to be connected to the bus are mounted. The connectors 41 to 44 are mutually linked with to each other via a bus wiring 10 called "main line". The main line 10 ends with terminal resistors or terminators 200 and 201. Namely, each end of the line 10 is provided with matched termination. In each of the terminators Rtt 200 and 201, one end thereof is linked with a termination voltage source Vtt 300.

Numerals 1 to 4 respectively denote modules connected to the bus via the connectors 41 to 44, respectively. In this regard, a module indicates a functional circuit board to transmit or to receive data to or from another functional circuit or module via a bus disposed on a backboard or backplane 0. A numeral 21 denotes a driver to send a signal to the bus, and numeral 32 to 34 represent receivers each to receive a bus signal. The driver 21 and receivers 32 to 34 are linked with the connectors 41 to 44 respectively via wirings or stubs 11 to 14.

In the circuit system above, when each of the stubs 11 to 14 has a line length which cannot be negligible when compared with a distance propagated by a signal in a fall or rise time of the propagation waveform, there appears discrepancy in the characteristic impedance between the stub and the main line 10, leading to waveform distortion. Namely, when a signal is outputted via the stub line 11, the characteristic impedance thereof is half that of the original value in the main line 10. This is because the signal from the stub 11 is subdivided into two signals in the main line 10, namely, a signal passing to the Rtt 200 and a signal flowing toward the Rtt 201.

Since the characteristic impedance varies between the stub 11 and the main line 11, there occurs a signal reflection. For example, when the stubs 11 to 14 and main line 10 each have a characteristic impedance of 50 ohms, the voltage reflection coefficient is expressed as follows.

$$\Gamma = (Z1-Z0)/(Z1+Z0) \quad (1)$$

where, Zo indicates the characteristic impedance of a first line in which the signal is propagating and Z1 denotes the characteristic impedance of a second line connected to the first line. Assuming the signal propagates from stub 11, the first and second lines are the stub 11 and the main line 10 having two branches at the point thereof to which the stub 11 is connected. Assigning the specific values to expression (1), the reflection coefficient $\Gamma$ is attained as follows.

$$\Gamma = (25-50)/(25+50) = -\frac{1}{3}$$

This means that a reflection of about 33% takes place.

The resultant reflection wave appearing at the connection point between the stub 11 and the main line 10 reversely propagates through the stub 11 and then totally and negatively reflects at a point of the driver 21 ($\Gamma \approx -1$). This occurs because of the low output impedance of the driver 21. The totally reflected wave again propagates through the stub 11. Since the wave is repeatedly reflected between the stub 11 and the main line 10, the waveform is distorted.

FIG. 3 shows a result of waveform distortion simulated in a simulation circuit of FIG. 4. In FIG. 4, the constituent elements corresponding to those of FIG. 2 are assigned with the same reference numerals and hence it will be appreciated that description thereof is unnecessary. This also applies to the subsequent description.

The configuration of FIG. 4 includes 12 modules, however, only four modules are specifically shown. The remaining modules each are of the same constitution. The system includes stubs L1 to L12, which each have almost the same function as the stubs 11 to 14 of FIG. 2. For the input circuits 32 to 34 of FIG. 2, capacitors C1 to C12 each having a capacitance of 10 picofarad (pf) are employed as models thereof.

The driver 21 of FIG. 2 is transformed into a model including a resistor RS and a power source P1 in FIG. 4. Resistors R1 to R12 are disposed to respectively connect the stubs L1 to L12 to the main line 10. The distance between the resistors R1 to T12 is 30 millimeters (mm), while the stub L1 to L4 each has a length of 30 mm.

Voltage waveforms respectively of the capacitors C1, C2, and C12 are indicated as VP1, VP2 and VP4, respectively. Namely, VP1 is a driver waveform, VP2 denotes a waveform at a position nearest to the wave propagation start point on the bus, and VP4 represents a waveform at a position farthest from the wave propagation start point on the bus.

The simulation is conducted with the following parameter values.

Termination voltage source: Vtt 300=1.65 V
Terminator: Rtt 200, 201=36 ohms
Matching resistance: R1 to R12=0.1 ohm Characteristic impedance of main lien 10: Zo=50 ohms
Characteristic impedance of stubs L1 to L12:
Z1=75 ohms
Capacitance: C1 to C12=10 pf
Voltage source: P1=0 V
Driver output impedance: RS=10 ohms and 1 megaohm
Switching time of driver output impedance: 0.5 nanosecond (period=25 megaherz (MH))

FIG. 3 shows the voltage waveforms VP1, VP2, and VP4 attained by achieving the simulation with the parameters of the circuit elements of FIG. 4 set as above. When the driver output impedance RS is changed from 10 ohms to 1 megaohm, the waveform is remarkably distorted due to a rapid change of the impedance RS in a short switching period of 0.5 ns. To overcome this disadvantage in the GTL module, as described in the literature, specifically, in pages 269 to 290 of the "Nikkei Electronics", September 27 (No. 591), there is arranged a control circuit to elongate the switching time so as to smooth waveform rising and falling edges, thereby suppressing the waveform distortion.

As above, due to the remarkable waveform distortion caused by the characteristic impedance discrepancy between the stubs and the main line and the difference between the output impedance and the characteristic impedance of the stubs, there has been a problem of the remarkable waveform distortion and hence the operating frequency cannot be increased.

FIG. 5 shows waveforms of signal voltages similarly simulated using a driver circuit of the push-pull CTT module.

The equivalent circuit of the system of FIG. 6 is the same as that of FIG. 4 using the open-drain GTL module. The difference resides in the output impedance RS and the power source P1. The parameters thereof are as follows.

Driver output impedance: RS 10 ohms
Voltage source P1=0 V and 3.3 V with repetitive pulse voltage period=25 MHz (rise/fall time=0.5 ns)

In FIG. 5, the waveform VP4 at the farthest position is considerably ringing although not so conspicuous as that of the open drain GTL shown in FIG. 3. The cause of waveform distortion is also the same as for that appearing in the GTL module of FIG. 1B. This means that due to the characteristic impedance discrepancy between the stubs and the main line and the difference between the output impedance and the characteristic impedance of the stubs, there arises a problem of the remarkable waveform distortion and hence it is impossible to increase the operating frequency. Additionally, there has been a problem that the signal-level compatibility is missing between the open drain interface used in the GTL module and the push-pull interface of the CTT module.

SUMMARY OF THE INVENTION

It is therefore an object of the present invention to provide an information processing apparatus in which the distortion in the propagation waveform is minimized to increase the signal transmission speed.

Another object of the present invention is to provide an information processing apparatus in which the distortion in the propagation waveform is minimized without changing the existing GTL or CTT modules, thereby increasing the signal transmission speed.

Furthermore, still another object of the present invention is to provide an information processing apparatus capable of conducting data transmission using such interfaces related to mutually different reference voltages as the open-drain interface of a GTL unit and the push-pull interface of a CTT module.

Further another object of the present invention is to provide an information processing apparatus capable of conducting data transmission in a configuration in which modules operating with mutually different reference voltages are connected to a bus for data transmission.

Still another object of the present invention is to provide a backboard to establish connection to stub series terminated transceiver logic (SSTL) modules including matching resistors.

To achieve the above objects in accordance with the present invention, there is provided an apparatus including a bus for transmitting signals therethrough, at least one module connected to the bus for transmitting and receiving signals to and from the bus, terminators respectively arranged at both ends of the bus for providing matched termination according to a characteristic impedance of the bus connected to the module, and a matching resistor disposed between the bus and the module. Assuming that the characteristic impedance of the module is Z1 and that of the bus is Z0, the matching resistor has a resistance value of KZ1−Z0/2 (0.8<K<1.3). The module, matching resistor, and bus are connected to each other in series.

Moreover, there is provided an information processing apparatus according to the present invention including a backboard, at least one module, and a connector to connect the backboard to the module. The backboard includes a bus for transmitting signals therethrough, at least one module connected to the bus for transmitting and receiving signals to and from the bus, and terminators respectively arranged at both ends of the bus for providing matched termination according to a characteristic impedance of the bus connected to the module. The module includes a matching resistor disposed between the bus and the module. Assuming that the characteristic impedance of the module is Z1 and that of the bus is Z0, the matching resistor has a resistance value of KZ1−Z0/2 (0.8<K<1.3). The module, matching resistor, and bus are connected to each other in series.

According to the present invention, there is provided an information processing apparatus including a backboard, at least one module, and a connector to connect the backboard to the module. The backboard includes a bus for transmitting signals therethrough, at least one module connected to the bus for transmitting and receiving signals to and from the bus, terminators respectively arranged at both ends of the bus for providing matched termination according to a characteristic impedance of the bus connected to the module and a matching resistor disposed between the bus and the module. Assuming that the characteristic impedance of the module is Z1 and that of the bus is Z0, the matching resistor has a resistance value of KZ1−Z0/2 (0.8<K<1.3).

In addition, the information processing apparatus according to the present invention includes, when the matching resistor is provided on the module side, a circuit for detecting presence of the matching resistor on the module side at installation of the module in the backboard and automatically establishing a short-circuit to the matching resistor of the module.

In the information processing apparatus according to the present invention including at least one module on a bus of the backboard, a matching resistor is arranged between a stub of the module and the bus of the backboard to match the characteristic impedance of the bus viewed from the stub. This prevents the multiple signal reflections at the ends of the stub and resultantly suppresses the waveform distortion. Therefore, the waveform distortion is reduced when transferring data and hence it is possible to increase the data transfer speed.

According to the present invention, the matching resistor is installed in the backboard on which a bus is mounted. This leads to an advantage that a high-speed data transfer can be conducted with reduced waveform distortion by using commonly known drivers including an open-drain driver like a GTL module and a push-pull driver such as a CTT module.

In addition, the reference and termination voltages of input circuits (receivers) supplied to modules having the GTL or CTT interface are regulated by the Vref control circuit. It is therefore possible to transfer data between such different modules connected via a bus to each other.

When data is transferred via the bus between the modules operating with different power source voltages, the power source voltage necessary for each module can be identified, thereby appropriately supplying the power source voltages to the respective modules.

With this provision, an end user can install a new module having new functions while continuously utilizing existing modules, the new module including a bus interface and a module power source different from those of the existing modules.

BRIEF DESCRIPTION OF THE DRAWINGS

These and other objects and advantages of the present invention will become apparent by reference to the following description and accompanying drawings wherein:

FIG. 11 is a diagram showing an embodiment of the present invention in which the modules include an open-drain driver of the GTL module or the like and a push-pull driver of the CTT module or the like;

DESCRIPTION OF THE PREFERRED EMBODIMENTS

Figure 2:
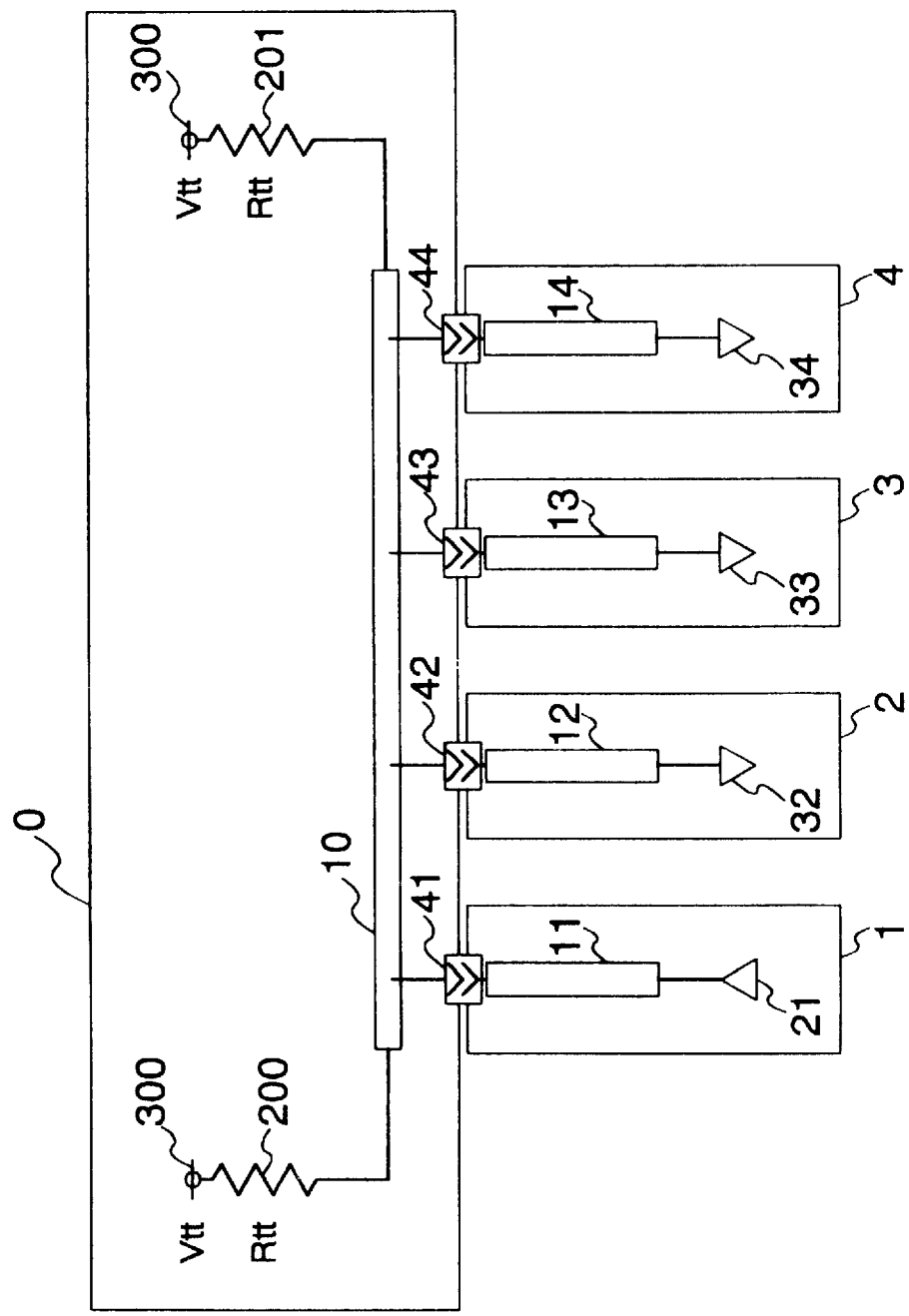
FIG. 2 is a diagram showing an example of the conventional bus wiring configuration.
Figure 3:
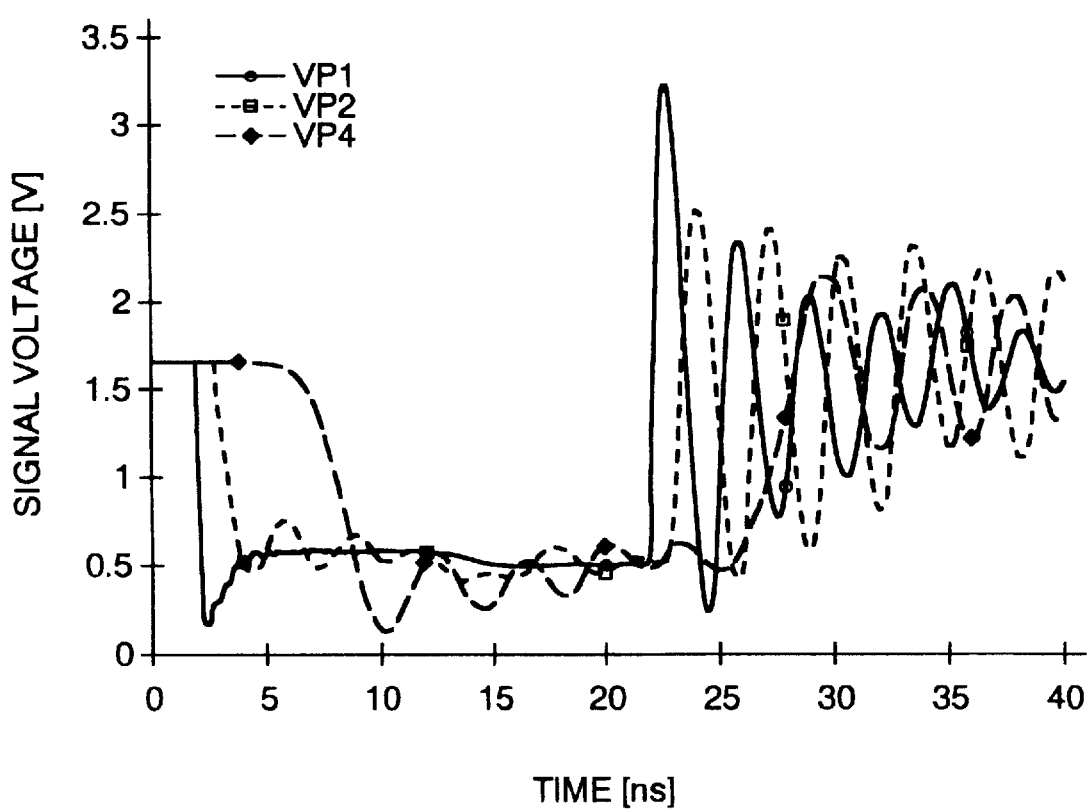
FIG. 3 is a graph showing waveforms of signals of an open-drain driver of the GTL module or the like of the prior technology.
Figure 6:
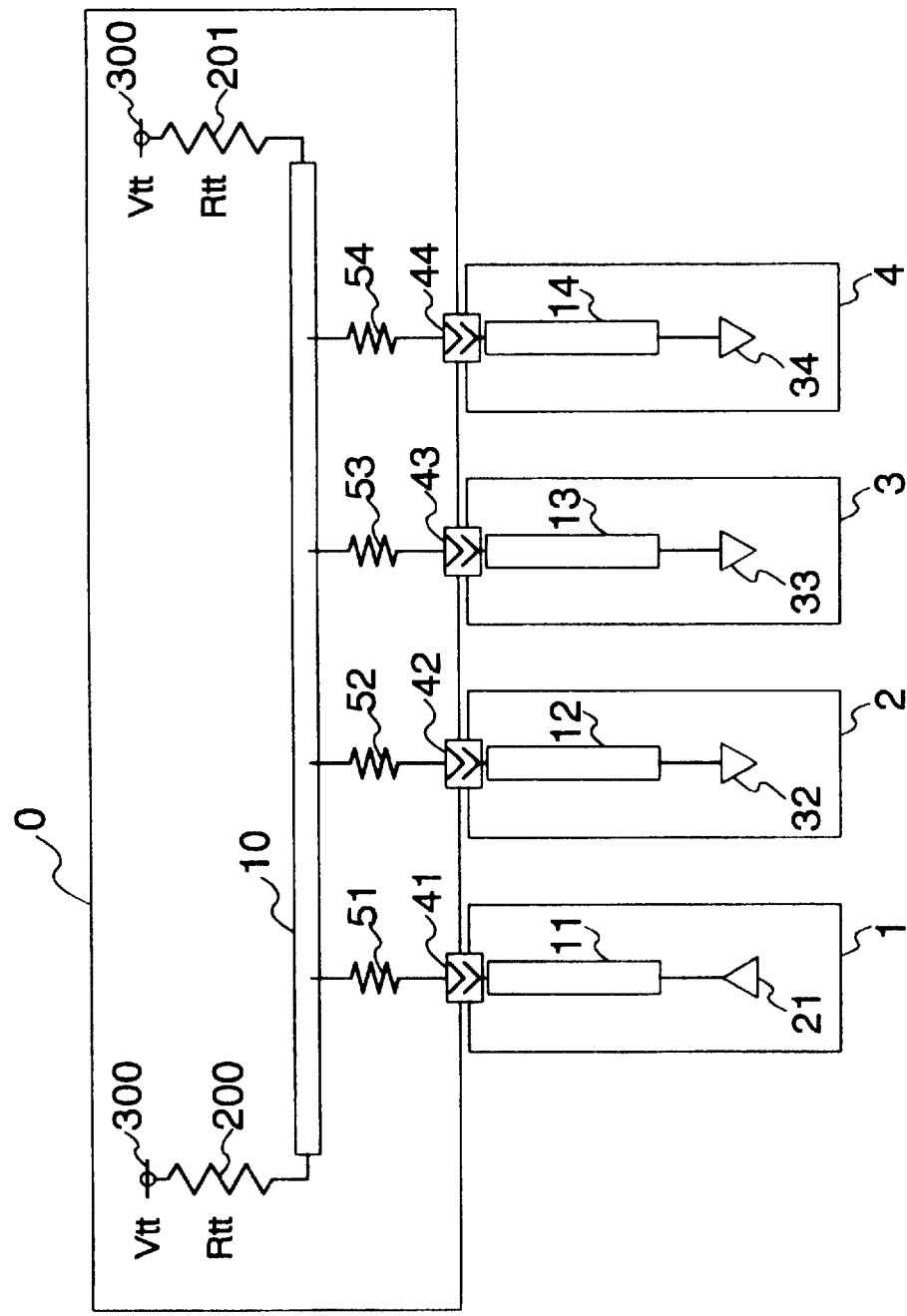
FIG. 6 is a diagram showing an embodiment according to the present invention.

FIG. 6 shows an embodiment according to the present invention. In this construction, the same constituent components as those of FIG. 2 are assigned with the same reference numerals. Numerals 51 to 54 indicate matching resistors mounted on a backboard 0 between a bus and connectors 41 to 44, respectively.

To minimize distortion in the propagation waveform, it is only necessary to set the matching resistors to values which lead to the suppression of signal reflection between stubs and the bus.

Reflection coefficient $\Gamma$ of FIG. 6 can be derived as follows.

$$\Gamma = ((Rm + Z0/2) - Z1)/((Rm + Z0/2) + Z1) \quad (2)$$

Figure 4:
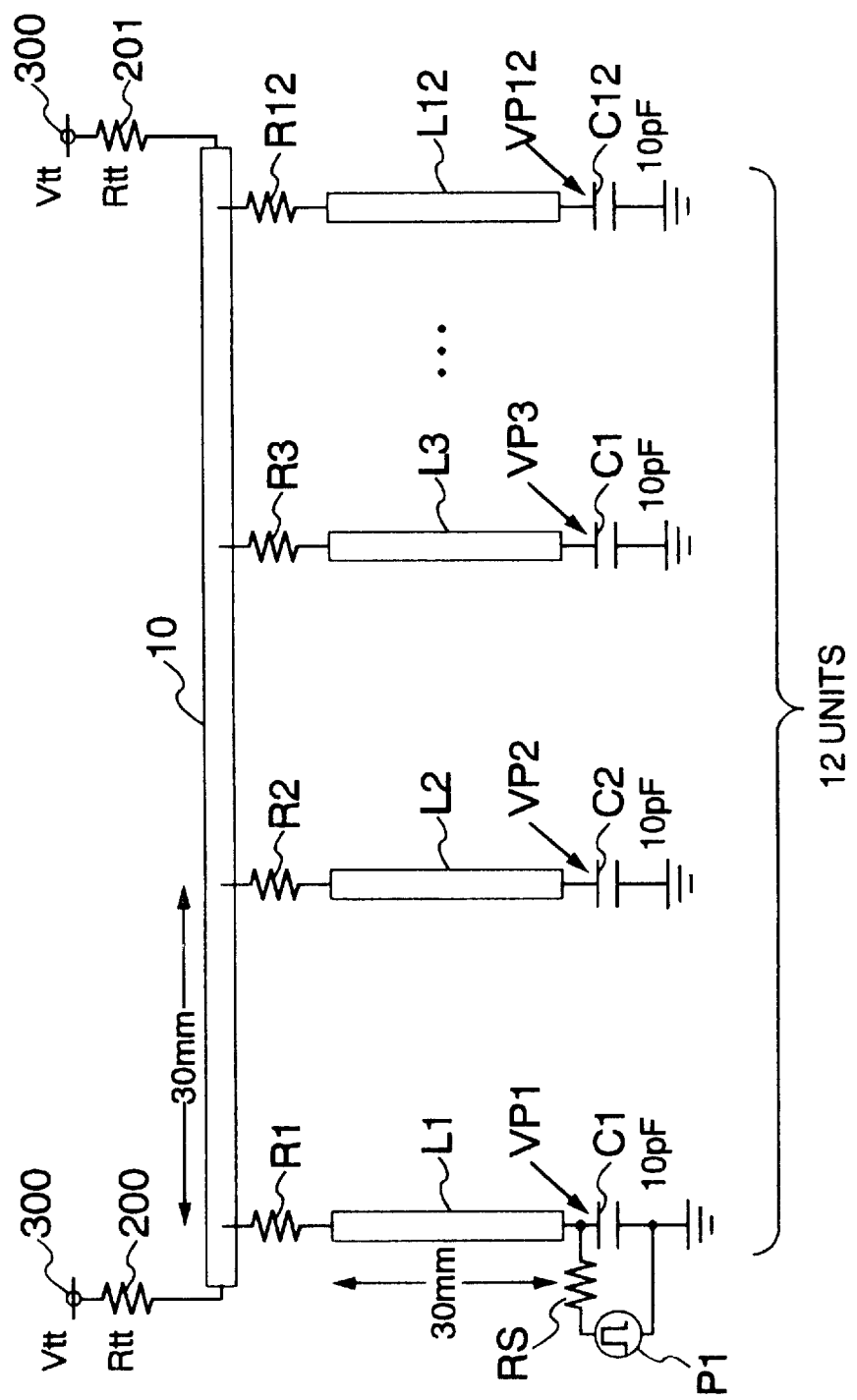
FIG. 4 is a diagram showing an equivalent circuit for simulation of the circuit shown in FIG. 2.
Figure 5:
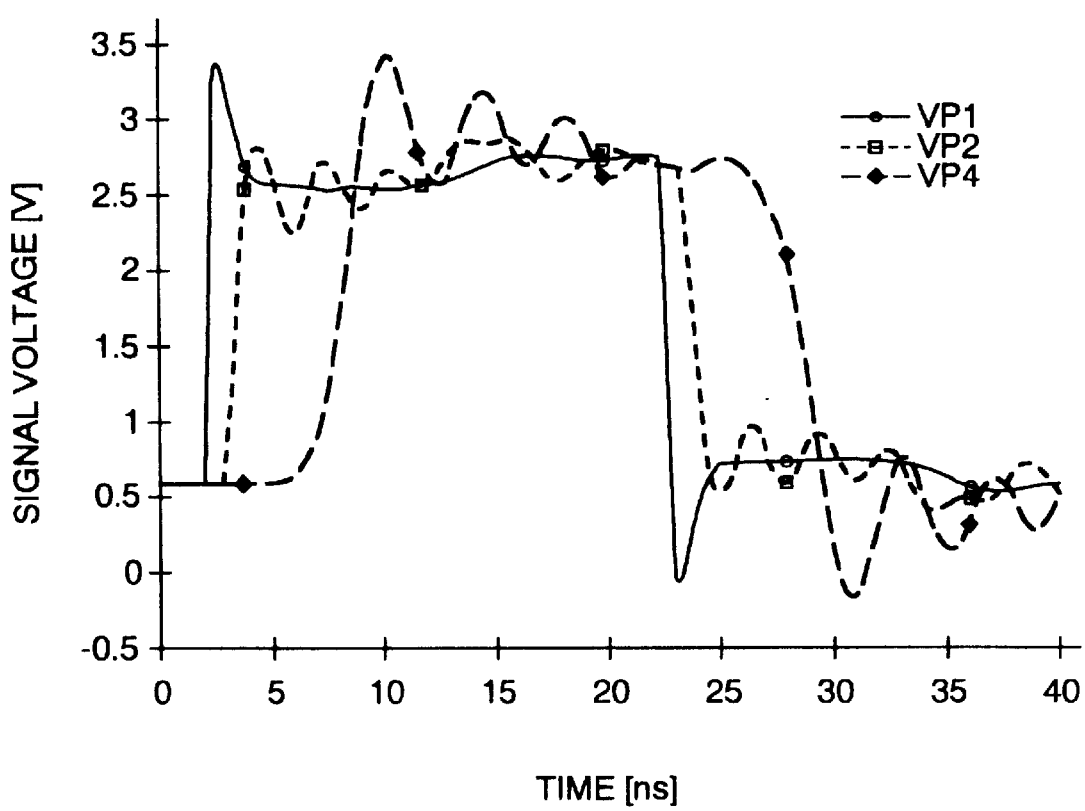
FIG. 5 is a graph showing waveforms of signals of a push-pull driver of the CTT module or the like of the prior art.
Figure 7:
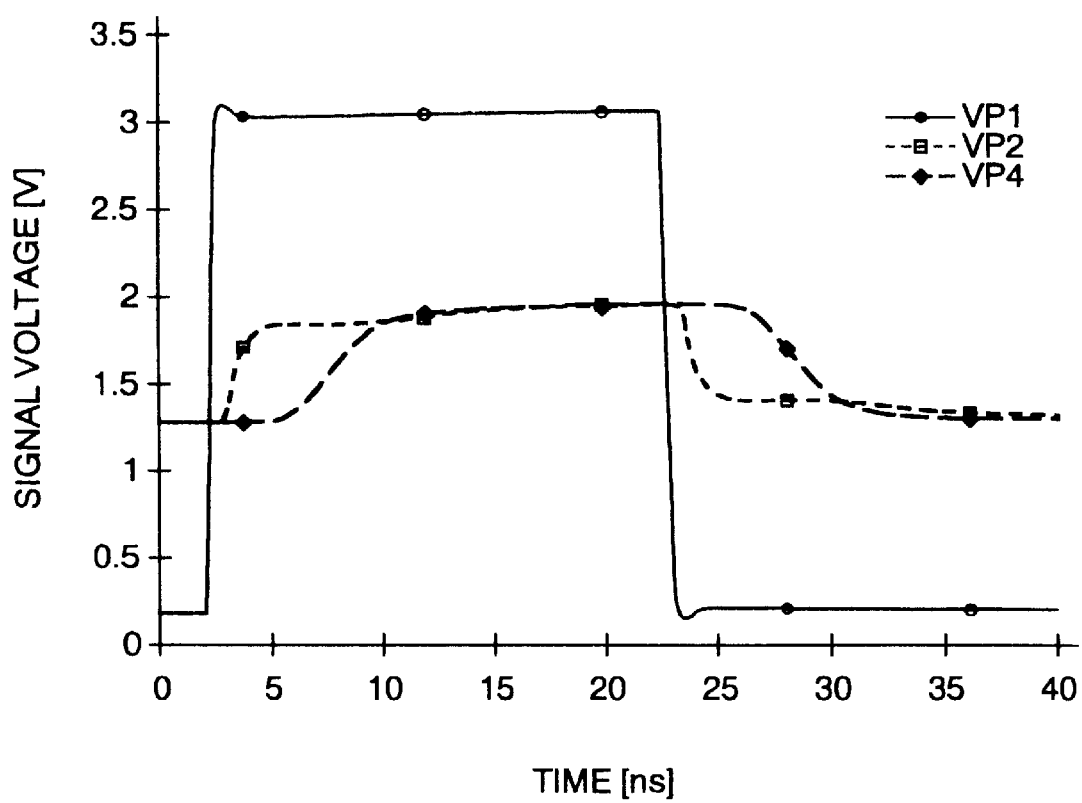
FIG. 7 is a graph showing waveforms of signals in the embodiment of FIG. 6.

According to expression (2), the value (Rm) of each of the matching resistors 51 to 54 for the condition $\Gamma=0$ is represented as $$Rm = Z1 - Z0/2 \quad (3)$$

where, Z1 is the characteristic impedance of each of the stubs 11 to 14 and Z0 denotes that of the bus 10. The simulation is carried out using the following parameters in the circuit of FIG. 6. FIG. 7 shows the simulation results. In the simulation, the equivalent circuit shown in FIG. 4 is also used for the circuit of FIG. 6. In the simulation model, capacitors are adopted as input receivers and a series connection of a pulsated power source P1 and a source resistor Rs is employed as the driver 21. To evaluate operation with a heavy load in the circuit of FIG. 6, there are used 12 modules.

Termination voltage source: Vtt 300=1.65 V

Terminator: Rtt 200, 201=36 ohms

Characteristic impedance of bus 10: Zo=50 ohms

Characteristic impedance of stub L1 to L12: Z1=75 ohms

Matching resistor: R1 to R12: 50 ohms

Capacitor: C1 to C12=10 pF

Driver output impedance: RS=10 ohms

Voltage source: Repetitive pulsated voltage P1=0 V and 3.3 V (25 MHz; rise/fall time=0.5 ns)

Figure 1A:
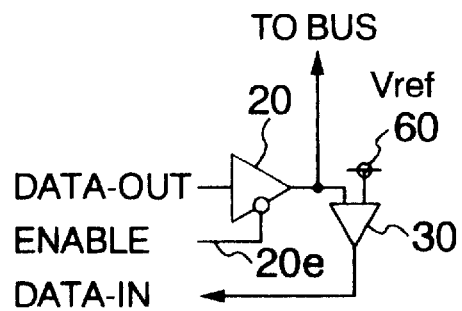
FIGS. 1A to 1C are diagrams showing examples of the bus interface circuit of the prior art.
Figure 1B:
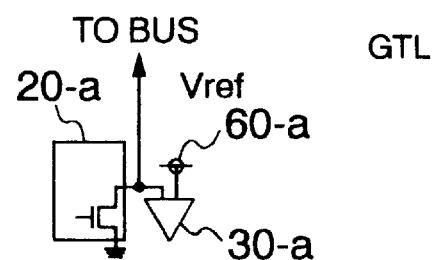
Figure 1C:
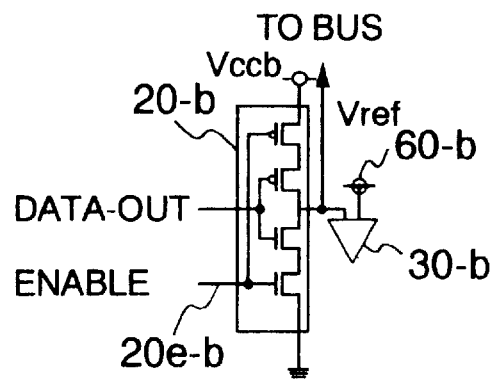

As can be seen from the waveform graph of FIG. 7, the waveforms of signals respectively at the nearest and farthest end points VP2 and VP4 are free of ringing and are hence quite smooth. That is, inserting the matching resistors according to expression (3) between the stubs and the bus, the waveform distortion of signals propagated through the bus can be remarkably reduced. The signal level is reduced due to the insertion of matching resistors 51 to 54. Although not shown in FIG. 7, using comparators like the GTL and CTT for the input circuits 32 to 34, the signal discrimination can be achieved. Namely, it is only necessary to set the reference voltage Vref of the comparator-type receiver 30 of FIG. 1A to be equal to the termination voltage, i.e., Vtt=1.65 V in this case.

Subsequently, description will be given of an optimal range of matching resistors 51 to 54.

Figure 8:
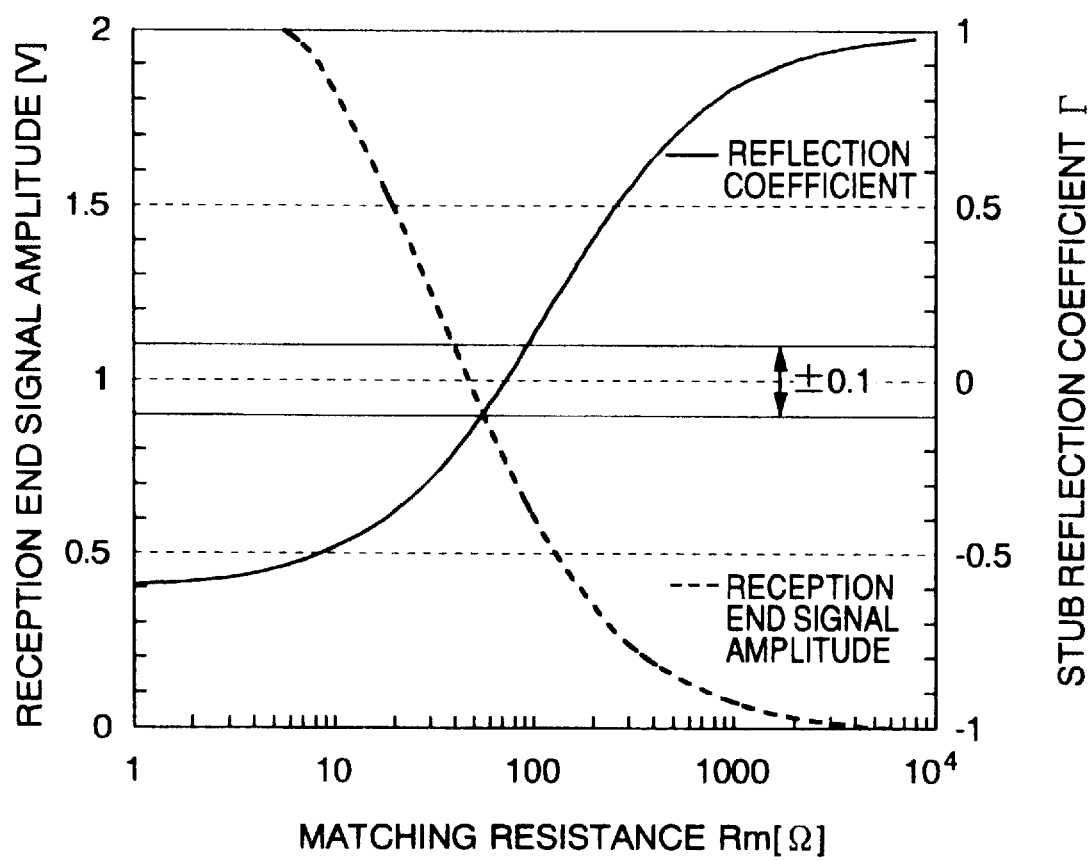
FIG. 8 is a graph for explaining the matching resistance, signal amplitudes at reception ends, and stub reflection coefficient.

FIG. 8 shows signal amplitudes at the reception ends (VP2 and VP4) and reflection coefficient $\Gamma$ obtained by altering the values of matching resistors 51 to 54. The parameters are set to the values used in the simulation associated with FIG. 7. Reflection coefficient $\Gamma$ gradually increases as the values of matching resistors 51 to 54 become greater. When the resistors 51 to 54 are set to the values represented by expression (3), the coefficient F takes a value of 0. In practices, the value of coefficient $\Gamma$ need not be necessarily set to zero, i.e., the value may be in the range of about −0.1 to about +0.1. In this situation, the matching resistance value Rm is obtained according to expression (2) as follows.

$$Rm = k \cdot Z1 - Z0/2 \quad (0.8 < k < 1.3) \quad (4)$$

where, $k = (1+\Gamma 2)/(1-\Gamma)$ which is attained by inserting the value of coefficient $\Gamma$ within the range $-0.1 \leq k \leq 0.1$. The lower-limit and upper-limit values are respectively rounded off and up at the second position below the decimal point so that the values of coefficient $\Gamma$ includes +1 and −1.

Moreover, as indicated by a dotted line, the signal amplitude at each of the reception end points (VP2 and VP4) decreases as the resistance values increased. In this case, the signal is required to possess an amplitude which can be discriminated by the comparator-type receiver 30 of FIG. 1A. The discriminable signal amplitude is in a range from about −0.2 V to about +0.2 V. To reserve a noise margin of about 0.2 V, the amplitude is required to be 0.6 V or more. The matching resistance Rm to set the signal amplitude to Vkswing or more at the reception end points (VP2 and VP4) is derived as follows.

The signal amplitude Vkswing at the reception end (VP2, VP4) is the difference between the L-level voltage $V_{KL}$ and the H-level voltage $V_{KH}$ and is therefore calculated as follows.

$$Vkswing = V_{KH} - V_{KL}$$

Using the termination voltage Vtt, matching resistance Rm, driver source resistance Rs, and terminator resistance Rtt, these voltages $V_{KH}$ and $V_{KL}$ are represented as follows.

Since the terminator Rtt is terminated at both ends thereof, the resistance thereof in terms of the direct current is equivalent to a value obtained when the terminator is arranged in a parallel connection. Namely, the effective resistance is half the original value. The voltage $V_{KL}$ is the potential on the bus side of the terminator Rtt when the terminator Rtt in parallel connection (having an effective resistance of Rtt/2), matching resistor Rm, and source resistor Rs are connected in series between the termination voltage source Vtt and the ground potential GND. That is, the voltage $V_{KL}$ is represented as follows.

$$V_{KL} = Vtt \cdot (Rs + Rm)/(Rs + Rm + Rtt/2)$$

Additionally, the voltage $V_{KH}$ is the potential on the bus side of the terminator Rtt when the driver is connected between the power source voltage Vccb and the termination voltage Vtt via the source resistor Rs, matching resistor Rm, and terminator Rtt in parallel connection (having an effective resistance of Rtt/2) in series connection. Namely, the voltage $V_{KH}$ is expressed as follows.

$$V_{KH} = (Rtt/2) \cdot (Vccb - Vtt)/(Rs + Rm + Rtt/2) + Vtt$$

Assigning $V_{KL}$ and $V_{KH}$ to the expression of Vkswing and a condition that the Vkswing takes a specified value or more, the following relationship is obtained.

$$Rm \leq Rtt \cdot (Vtt/Vk\text{swing} - 0.5) - Rs \tag{5}$$

According to expressions (2) and (3), to set reflection coefficient Γ in the range from −0.1 to +0.1 for the reduction of the waveform distortion and to set the signal amplitude to 0.6 V or more at the reception end points, it can be understood from the waveform graph of FIG. 8 that the optimal values of the matching resistors 51 to 54 are required to be in a range from 56 ohms to 97 ohms.

Setting the matching resistors 51 to 54 according to the optimal zone ranging from 56 ohms to 97 ohms, the signal waveform distortion is minimized and the signal amplitude necessary for the signal discrimination can be obtained. This leads to an advantage of a high-speed and stable transfer of data through the bus.

When the module interface is configured as shown in FIG. 6, the impedance is smoothly altered from the stubs to the bus, resulting in an advantage of the remarkable reduction in the waveform distortion of signals propagating through the bus.

Additionally, since the matching resistors 51 to 54 are respectively arranged between the bus 10 and the connectors 41 to 44, electrostatic capacitance of the connectors 41 to 44 is connected via the resistance to the bus 10. This consequently prevents disturbance and reduction in the impedance of the bus 10 and therefore leads to an advantageous effect of minimization of the signal waveform.

The construction of the embodiment differs from the configuration of FIG. 2 only in the matching resistors 51 to 54 on the backboard 0. That is, even when the modules 1 to 4 shown in FIG. 2 are used in this embodiment, impedance matching is established between the bus and the stubs 11 to 14 respectively of the modules 1 to 4 and hence the waveform distortion can be decreased. In other words, there is attained a favorable effect that the data transfer speed can be increased on the bus only by mounting the resistors on the backboard 0 without any substantial modification of the modules 1 to 4. On this occasion, only the resistors are additionally installed on the backboard 0. Consequently, using a resistor box or the like, the apparatus can be advantageously produced without any additional cost.

Figure 9:
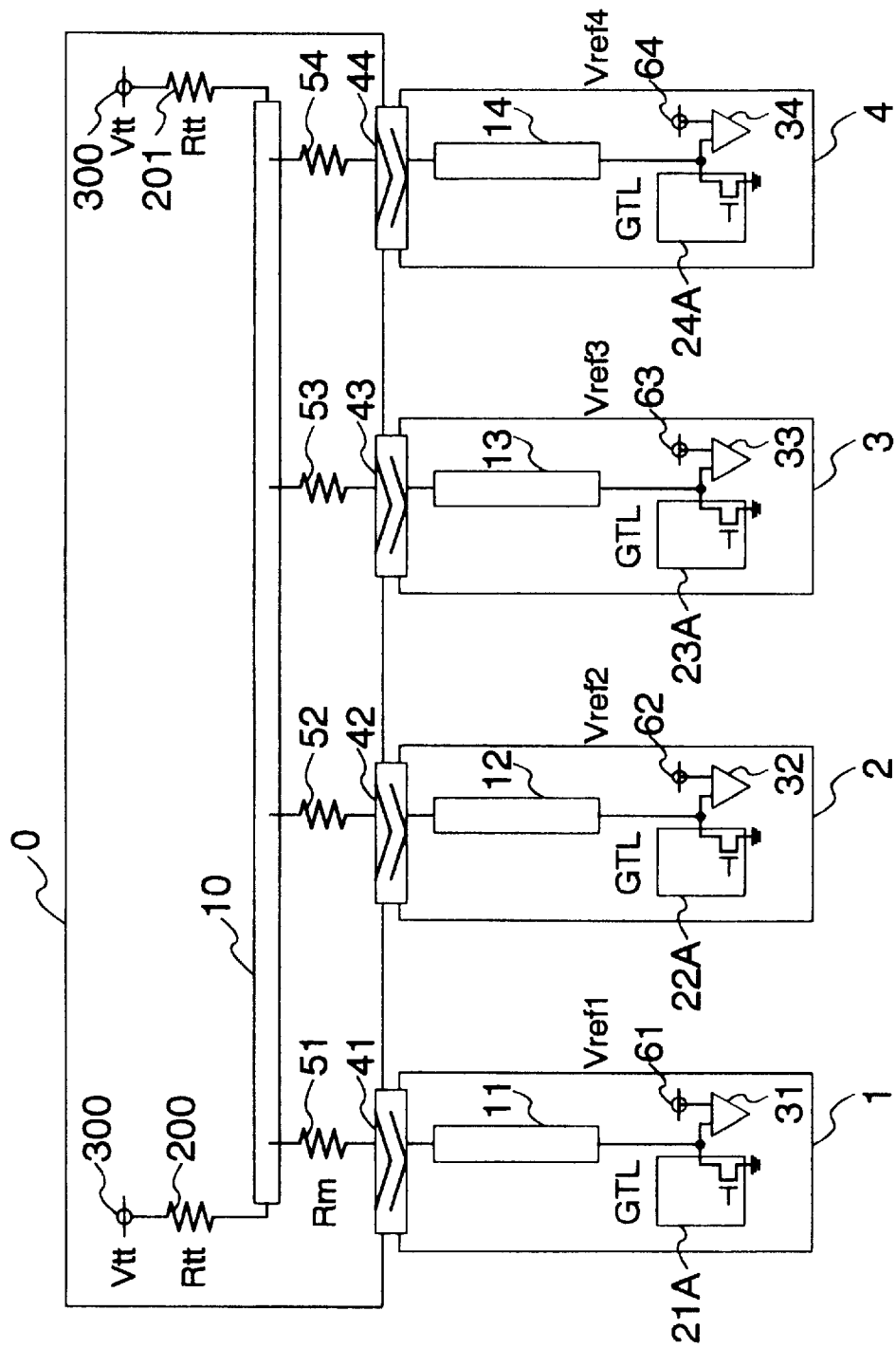
FIG. 9 is a diagram showing an embodiment of the present invention in which the module includes an open-drain driver of a GTL interface.

Referring now to FIG. 9, description will be given of an alternative embodiment according to the present invention.

Reference numerals 21A to 24A respectively indicate open-drain drivers. In this embodiment, the bus interface circuit of each module includes an open-drain driver. Numerals 31 to 34 denote comparator-type receivers. Numerals 61 to 64 represent reference voltages of the comparators 31 to 34. Although not shown in FIG. 9, the reference voltages Vref 61 to 64 are supplied from the backboard 0. The matching resistors 51 to 54 each take the value Rm represented by expression (4).

In this situation, the data signal level Vk at the reception end point is expressed as follows.

Signal H state: $V_{KH} = Vtt$

Signal L state: $V_{KL} = Vtt - Vtt \cdot Rtt/(2 \cdot (Rtt/2 + Rm + Rs))$ where, Rs designates the driver output impedance. The reference voltage Vref 61 to 64 of the receiver 31 to 34 is set to a value half that of the signal amplitude as follows.

Reference voltage for GTL output $$\begin{aligned} Vref &= (V_{KH} + V_{KL})/2 \\ &= (2 \cdot (Rm + Rs) + Rtt/2) \cdot Vtt/ \\ &\quad (Rtt + 2 \cdot Rm + 2 \cdot Rs) \end{aligned} \tag{6}$$

Regulating Vref 61 to 64 according to expression (6) as above, even when there is used the known open-drain drivers of GTL modules or the like, the waveform is stabilized and the operation speed is increased only by installing the matching resistors 51 to 54 in the backboard 0.

This implies an advantage as follows. In an existing apparatus of the user in which the function module includes the open-drain driver of the GTL module or the like, the operating frequency of the bus can be increased only by replacing the backboard. Namely, the user need not purchase another apparatus to increase the bus operating frequency. Resultantly, the system performance can be advantageously improved at a low cost.

Figure 10:
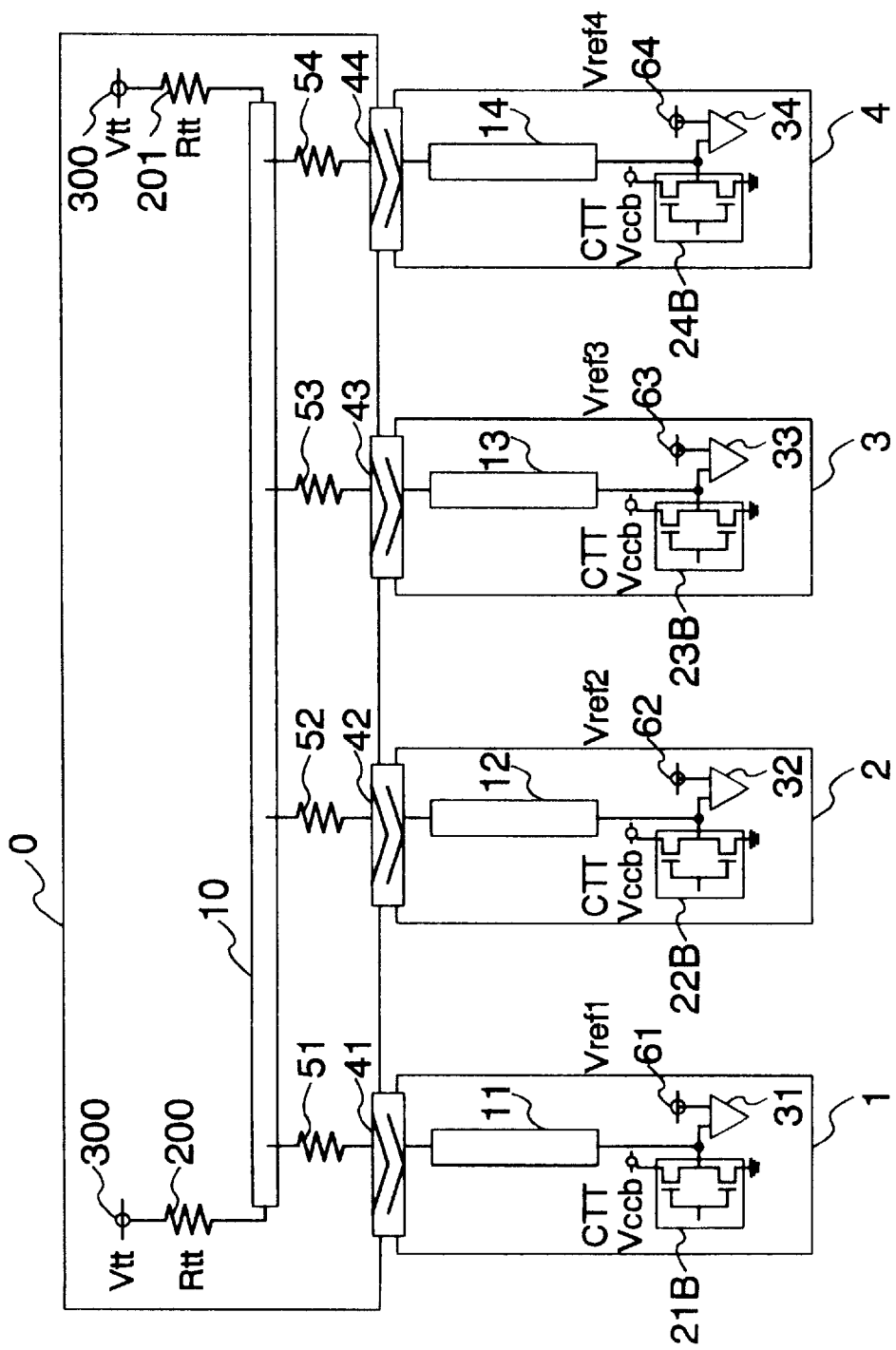
FIG. 10 is a diagram showing an embodiment of the present invention including as a module a push-pull driver of the CTT interface.

Subsequently, another embodiment of the present invention will be described by reference to FIG. 10.

Reference numerals 21B to 24B respectively indicate push-pull drivers. In this embodiment, the bus interface circuit of each module includes a push-pull driver. Numerals 31 to 34 denotes comparator-type receivers, and numerals 61 to 64 represent reference voltages of the comparators 31 to 34. Although not shown in FIG. 10, the reference voltages Vref 61 to 64 are supplied from the backboard 0. The matching resistors 51 to 54 take the value Rm according to expression (4).

When using CTT drivers, the value of Vtt is set as Vtt=1/2Vccb and hence the data signal amplitude at the reception end changes between the H and L levels equally centered on Vtt. For the signal discrimination, it is only necessary to set the voltage Vtt to the reference voltages Vref 61 to 64 of the respective comparators 31 to 34.

That is, by setting Vref=Vtt, even when there are used push-pull drivers of CTT modules or the like of the prior art, the signal waveform is stabilized and the operation speed is increased only by installing the matching resistors 51 to 54 in the backboard 0.

In other words, without changing the module, the data transfer speed is increased and the data transfer is stabilized.

This results in the following advantage. In an existing apparatus in which the function module includes the push-pull driver of the CTT module, the operating frequency of the bus can be increased only by replacing the backboard. Namely, it is not necessary for the user to purchase another apparatus to increase the bus operating frequency. As a result, the system performance is advantageously improved at a low cost.

Figure 11:
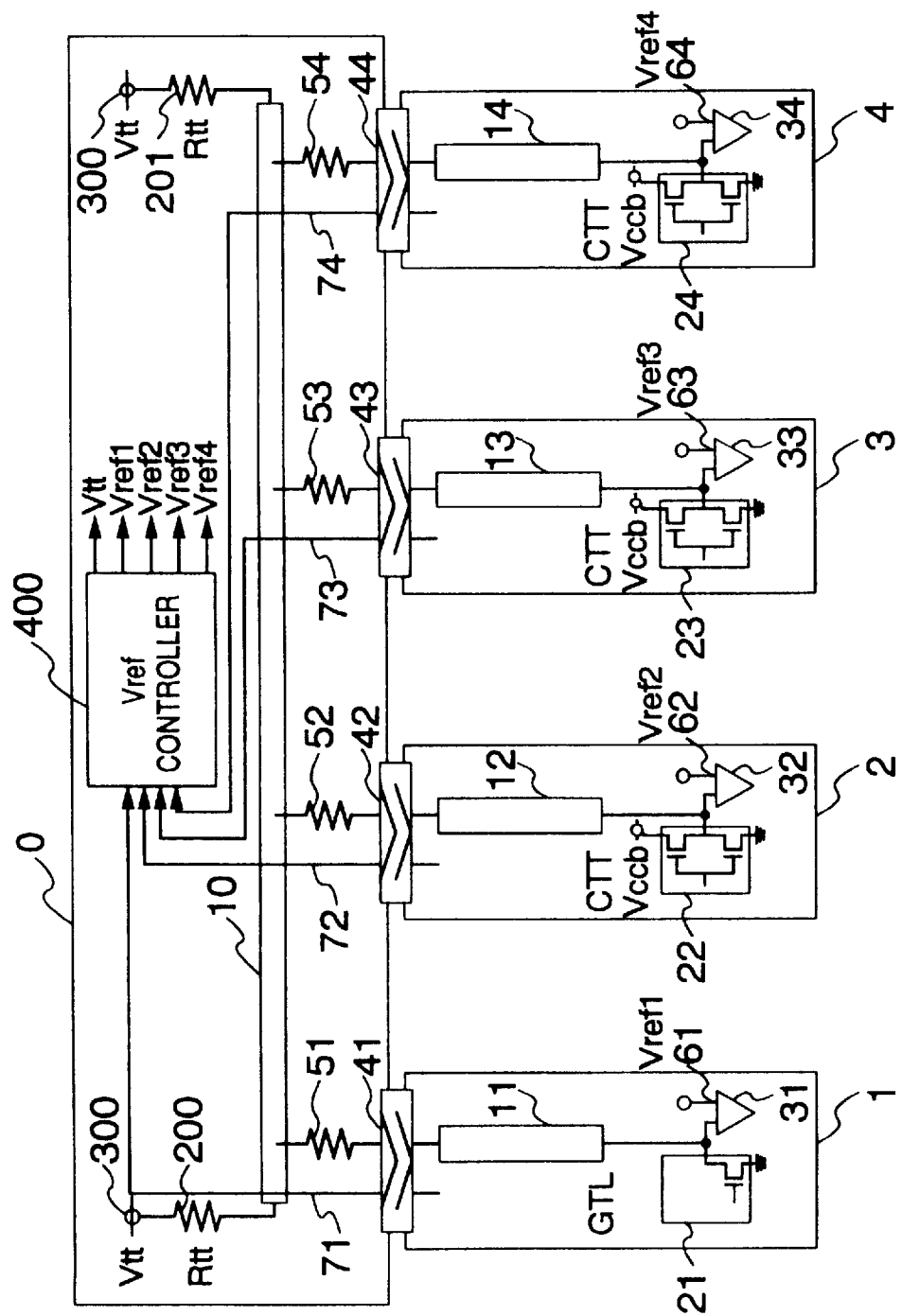

Referring now to FIG. 11, description will be given of another embodiment according to the present invention. In the embodiment, modules respectively include open-drain and push-pull drivers, which are arranged to appropriately carry out data transfer operations.

Numeral 1 indicates a module including an open-drain driver 21 of the GTL module in the bus interface circuit. Numerals 2 to 4 denote modules having push-pull drivers 22 to 24 of CTT modules or the like in the bus interface circuits. Numerals 31 to 34 represent comparator-type receivers to which reference voltages Vref1 to Vref4 (61–64) are supplied from the Vref control circuit 400 via the connectors 41 to 44, respectively. The termination voltage Vtt 300 is also controlled by and supplied from the Vref controller 400.

The matching resistors 51 to 54 have a resistance value of Rm in accordance with expression (4).

Numerals 71 to 74 stand for bus interface identifier signals respectively of the modules 1 to 4. The identifier signals 71 to 74 are created from the respective modules 1 to 4 to be connected respectively via the connectors 41 to 44 to the Vref controller 400. The identifier signals 71 to 74 are generated by the modules 1 to 4 according to the respective bus interface types. When two types of interfaces, e.g., GTL and CTT interfaces are present on the bus, the types can be represented by a binary value and hence by a one-bit signal. When three or more bus interfaces are employed, it is only necessary to generate the identifier signals according thereto. Moreover, the signal level need only be fixedly assigned to each interface circuit. In this regard, the operation to produce bus interface identifier signals may be achieved by the connectors.

When outputting data from the open-drain driver 21 of the module 1, a low-amplitude waveform having little waveform distortion propagates through the bus to the respective modules as shown in FIG. 7. The waveform distortion is minimized because impedance matching is established between the stub 11 and the bus 10 and hence there is missing the multiple reflection of the signal wave.

The received waveforms are respectively compared with the reference voltages 62 to 64 by the receivers 32 to 34 of the respective modules 2 to 4, thereby deciding that the pertinent data is at the "H" or "L" level. The bus signal level Vk of the modules 2 to 4 is expressed as follows.

Signal H state: $V_{KH}=Vtt$

Signal L state: $V_{KL}=Vtt-Vtt \cdot Rtt/(2 \cdot (Rtt/2+Rm+Rs))$ where, $V_{KH}$ and $V_{KL}$ stand for input signal voltages respectively of the receivers 32 to 34 when the drivers are respectively at the "H" and "L" states, Rs indicates the driver output impedance, Vtt denotes the termination voltage, Rtt designates the terminator resistance, and Rm represents the value of matching resistors 51 to 54.

When the reference voltages 62 to 64 are set to a value which is half the sum of the H-level and L-level voltages according to expression (7) as follows, it is guaranteed for the receivers 32 to 34 to latch data therein.
Reference voltage for GTL output $$Vref = (V_{KH} + V_{KL})/2 \quad (6)$$
$$= (2 \cdot (Rm + Rs) + Rtt/2) \cdot Vtt/$$
$$(Rtt + 2 \cdot Rm + 2 \cdot Rs)$$

In this case, like in the case of FIG. 9, the receivers 32 to 34 can discriminate data and hence there can be achieved a highly reliable data transfer with little waveform distortion at a high speed.

Next, description will be given of an operation to output data from the push-pull driver 24 of the module 4. Numerals 22 to 24 indicate in a simplified form MOS switching transistors for ENABLE signals. Data waveform from the driver 24 propagates through the bus, namely, a low-amplitude waveform travels through the bus with little waveform distortion to the respective modules (FIG. 7). The waveform distortion is reduced since impedance matching is established between the stub 14 and the bus 10 and hence there does not occur the multiple reflection of the data wave.

The waveforms are then respectively compared with the reference voltages 61 to 63 by the receivers 31 to 33 of the respective modules 1 to 3. As a result, the pertinent data is decided to be at the "H" or "L" level. The bus signal level Vk of the modules 1 to 3 is represented as follows.

Signal H state: $V_{KH}=Vtt+(Vccb-Vtt) \cdot Rtt/2 \cdot (Rtt/2+Rm+Rs)$ (8)

Signal L state: $V_{KL}=Vtt-Vtt \cdot Rtt/(2 \cdot (Rtt/2+Rm+Rs))$ (9)

where, $V_{KH}$ and $V_{KL}$ stand for input signal voltages respectively of the receivers 31 to 33 when the drivers are respectively at the "H" and "L" states, Rs denotes the driver output impedance, Vccb is the power source voltage to the CTT output driver 24, Vtt denotes the termination voltage, Rtt designates the terminator resistance, and Rm represents the value of matching resistors 51 to 54.

When the reference voltages 61 to 63 are regulated to be equal to half the sum of the H-level and L-level voltages according to expressions (8) and (9) and expression (10) as follows, it is guaranteed for the comparator type receivers 31 to 33 to latch data therein.
Reference voltage for CTT output $$Vref = (V_{KH} + V_{KL})/2 \quad (10)$$
$$= (2 \cdot (Rm + Rs) \cdot Vtt + Vccb \cdot Rtt/2)/$$
$$2(Rtt + 2 \cdot Rm + 2 \cdot Rs)$$

This is a condition associated with an optimal case for the output from the push-pull driver of the CTT module. However, this condition can be set to be equal to the condition related to the optimal case (expression (7)) of the open-drain driver of the GTL module. Namely, when Vtt=Vccb is assumed, expression (10) related to the reference voltage of the CTT drive operation becomes equal to expression (7) associated with that of the GTL drive operation. In other words, under the condition Vtt=Vccb, the same signal amplitude Vk and reference voltage Vref can be employed for any drivers regardless of the driver types.

In this situation, the final-stage output circuit of the CTT driver is in the push-pull (totem pole) configuration. In the transistor on the "H" side of the circuit, when Vtt is equal to Vccb, the drain-source voltage between the drain and source thereof is zero and is off regardless of the state of the output signal. Consequently, the totem-pole circuit in the final stage functions in the same fashion as the open-drain circuit. In this manner, the same signal amplitude and reference voltage are applicable to CTT and GTL modules and hence data can be appropriately transferred between these modules of different types. In this case, since impedance matching is naturally established between the stubs and the bus by the matching resistor Rm, a reliable high-speed data transfer can be conducted with a reduced waveform distortion.

As above, setting the matching resistor Rm according to expression (4) and the reference voltage of the comparator according to expression (7) and establishing the condition of Vtt=Vccb, the data transfer can be conducted between the modules of the different types respectively including open-drain and push-pull drivers.

Figure 12:
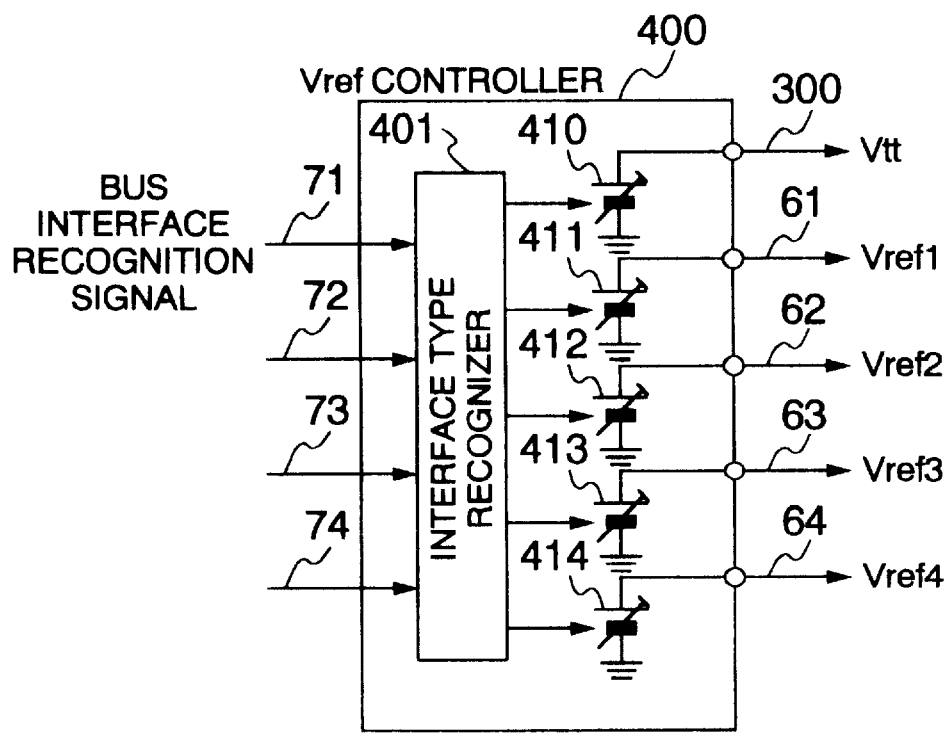
FIG. 12 is a diagram showing an embodiment of the reference voltage control circuit of FIG. 11.

A specific configuration and functions of the Vref controller 400 will be described with reference to FIG. 12. The Vref controller 400 supervises the reference voltage Vref and termination voltage Vtt supplied to the respective modules according to the respective types of bus interfaces thereof connected to the bus.

To the Vref controller 400 are inputted bus interface identifier signals 71 to 74; whereas, from the Vref controller 400 are outputted the reference voltages Vref1 61 to Vref4 64 respectively to the input receivers of the bus interfaces of the respective modules. The Vref controller 400 includes an interface type recognition circuit 401 to receive the bus interface identifier signals 71 to 74.

The recognizer 401 controls, when the recognition signals 71 to 74 entirely match the bus interface associated with the open-drain driver of the GTL module, internal power sources 411 to 414 to regulate the reference voltages 61 to 64 according to expression (7). The voltages of internal power sources 411 to 414 may be generated by controlling a voltage regulator or the like or by dividing the voltage applied to the Vref controller 400 for the following reasons. Namely, the comparator of the receiver does not consume any electric current and hence the voltage drop due to resistance does not take place. In addition, the recognizer 401 controls the internal power source 410 to set the termination voltage according to specifications of the driver connected to the bus. It is desirable that the voltage of the power source 410 is kept unchanged even when a current of the voltage regulator or the like flows.

Next, the recognizer 401 supervises, when each of the recognition signals 71 to 74 matches the bus interface related to the push-pull driver of the CTT module or the like, the internal power sources 411 to 414 to regulate the reference voltages 61 to 64 to be equal to the termination voltage Vtt. Additionally, the recognizer 401 controls the internal power source 410 to set the termination voltage according to specifications of the driver connected to the bus.

Moreover, when the interface recognition signals 71 to 74 are different from each other, namely, when GTL and CTT modules are present in the system, the recognizer controls the power source 410 to set the termination voltage Vtt 300 to be equal to the voltage Vccb supplied to the CTT module and supervises the internal power sources 411 to 414 to set the output reference voltages 61 to 64 according to expression (7).

In the description of the Vref controller 400, there are adopted only two types of bus interface circuits. However, when three or more interface types are employed, it is only necessary to supply reference voltages according to the types.

In the embodiment, the reference voltage is changed by the recognition circuit 401. However, the recognition circuit and the voltage control may be provided in a programmable configuration. In this case, at system initiation or during system operation, the reference voltage can be changed by the configuration software in an automatic fashion. In such a constitution, the known plug-and-play operation can be accomplished for modules respectively having various bus interfaces.

Figure 13:
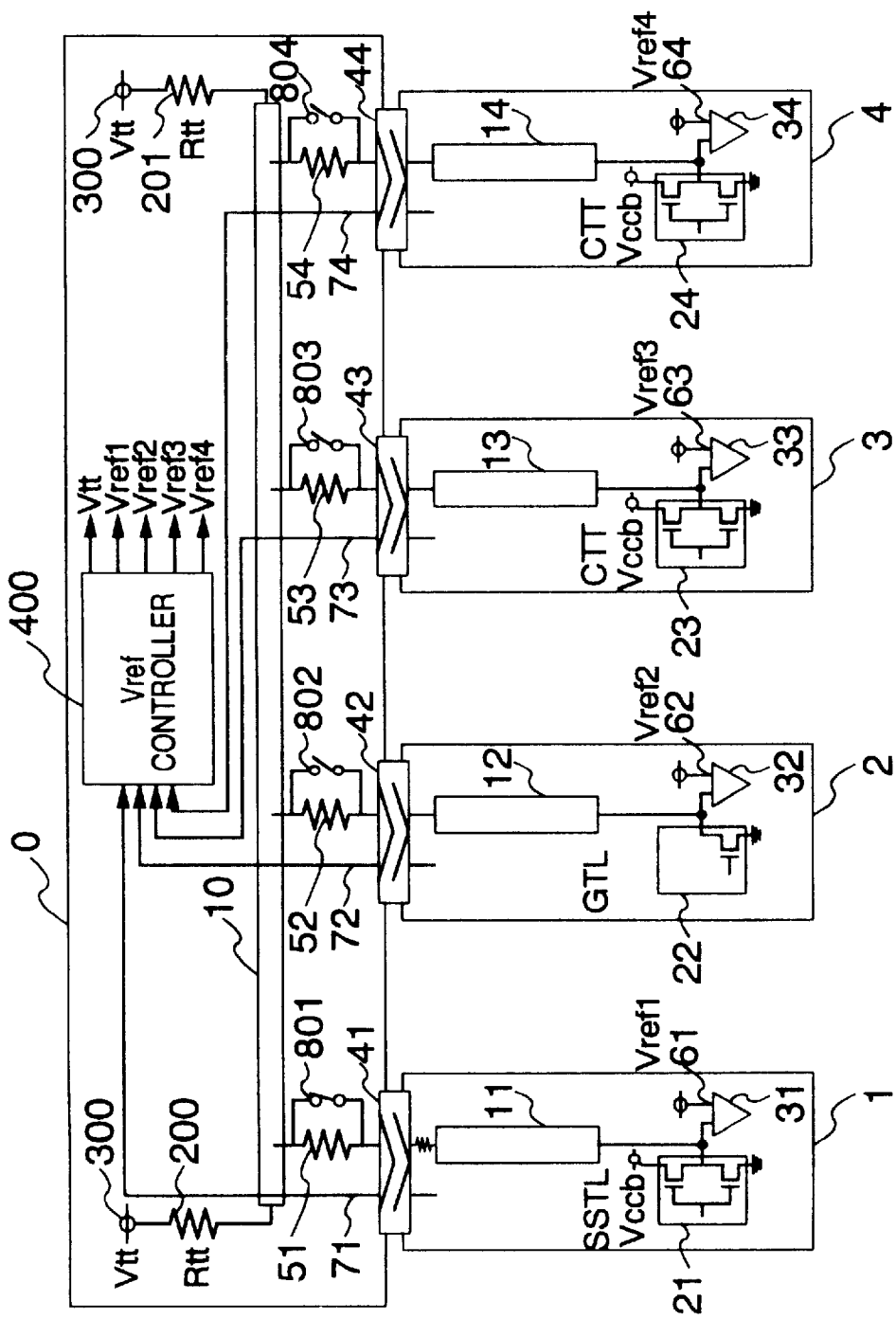
FIG. 13 is a diagram showing an embodiment with an SSTL module connected thereto.

Referring now to FIG. 13, description will be given of another embodiment according to the present invention. This embodiment includes a module having the stub series terminated transceiver logic (SSTL) interface. As can be seen from FIG. 14, according to the SSTL interface, data is communicated via a bus on a backboard including matching resistors 51 to 54 on the side of modules 1 to 4, the resistors 51 to 54 being set according to expression (4).

Figure 14:
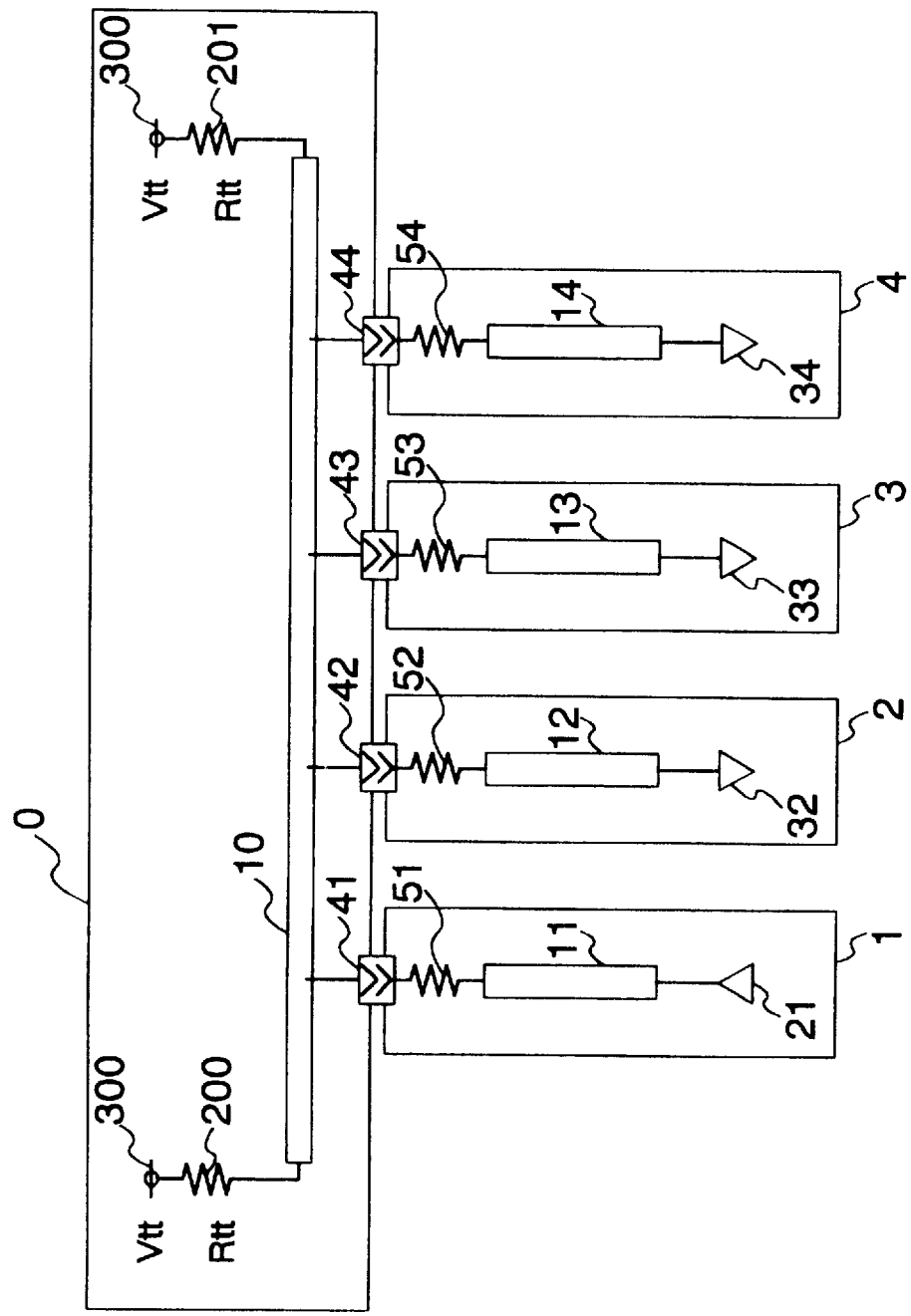
FIG. 14 is a diagram for explaining the SSTL module.

In FIG. 14, when the module 1 having the SSTL interface is a conventional module which enables a high-speed data transfer on the bus when connected to a system in which matching resistors are missing on a backboard thereof. An object of the embodiment is to enable a high speed data transfer on the bus even when a conventional SSTL interface module having matching resistors is connected to a backboard including matching resistors according to the present invention.

In FIG. 13, numeral 1 denotes a module having the SSTL interface. The module 1 is connected to the bus 10 via a push-pull driver 21, an interface circuit including a voltage comparing receiver 31, a stub 11, a connector 41, and a matching resistor 510.

The matching resistor 510 has a resistance value represented by expression (4), the value being equal to that of matching resistors 51 to 54.

Numerals 2 to 4 designate modules respectively including an open-drain driver 22 of the GTL interface, a push-pull driver 23 of the CTT interface, and a push-pull driver 24 of the CTT interface. Matching resistors are missing in the modules 2 to 4.

Numerals 31 to 34 are comparator-type receivers of which reference voltages Vref1 to Vref 4 (61–64) are supplied from the Vref controller 400 respectively via connectors 41 to 44 like in the case of FIG. 11. Moreover, the termination voltage Vtt 300 is also regulated by and supplied from the Vref controller 400.

Numerals 71 to 74 represent bus interface identifier signals respectively of the modules 1 to 4. The signals 71 to 74 are produced by the respective modules 1 to 4 and are connected respectively via the connectors 41 to 44 to the Vref controller 400.

Numerals 51 to 54 stand for matching resistors of which values are represented by expression (4). Numerals 801 to 804 indicate switching elements connected in parallel to the matching resistors 51 to 54, respectively. Although not shown in FIG. 13, the switching elements 801 to 804 are supervised by the Vref controller 400.

Subsequently, description will be given of the operation of the Vref controller 400 to control the switching elements 801 to 804. In this connection, the reference voltages 61 to 64 and termination voltage 300 are regulated in the same way as for the case of FIG. 11.

Receiving the interface identifier signal 71, the Vref controller 400 recognizes that the module 1 having a matching resistor of the SSTL interface has been installed in the backboard 0 and then activates the module 1 to turn the switching element 801 on, the element being connected in parallel to the matching resistor 51. The impedance of the element 801 is considerably smaller than the resistance value of the resistor 51.

When it is detected that the installed module 2, 3, or 4 has a bus interface of the GTL or CTT interface, namely, when the matching resistor is missing in the module, the Vref controller 400 supervises the module to retain the associated switching element 802, 803, or 804 in the off state.

With the control operation of the switching elements 801 to 804, the Vref controller 400 can provide between the bus 0 and each of the stub wirings 11 to 14 one matching resistor for the one-bit bus for the module, e.g., the SSTL module including a matching resistor on the bus as well as the module of the GTL or CTT interface not including a matching resistor thereon. Consequently, like in the case of FIG. 11, the impedance matching is established between the stub and bus due to the matching resistor, resulting in an advantage of a high-speed reliable data transfer with little waveform distortion. In addition, there is similarly obtained an advantageous effect of the high-speed data transfer even in a system including such modules of different types as modules including an SSTL module having a matching resistor on the bus and modules like GTL and CTT modules not including a matching resistor on the bus.

In a system in which the modules 1 to 4 include only one type of bus interface, i.e., CTL or CTT interface, when the switching elements 801 to 804 are conductive and the termination voltage Vtt and reference voltage Vref are set to values conforming to the specifications of the bus interface, there is advantageously retained operational compatibility with the conventional apparatus. This further leads to an favorable effect as follows. Since there are disposed matching resistors as above, if the system operation becomes unstable due to process fluctuation and/or timing deviation between the modules, the system can be advantageously set to a state in which the matching resistors are ineffective.

Although not shown in FIG. 13, even when the module of the GTL interface having an open-drain driver includes a matching resistor, it is advantageous that the data transfer is possible when the Vref controller 400 turns the switching element 801, 802, 803, or 804 related to the module on, sets the termination voltage Vtt to be equal to half the voltage Vccb supplied to the bus driver of the module, and supplies the reference voltage Vref according to expression (6).

When the modules to be installed in the respective connectors 41 to 44 include matching resistors and are fixedly assigned with positions of the respective connectors, namely, when the connectors are exclusively allocated to the respective modules, there is attained an advantage that the matching resistors and switching elements can be dispensed with on the backboard 0.

Figure 15:
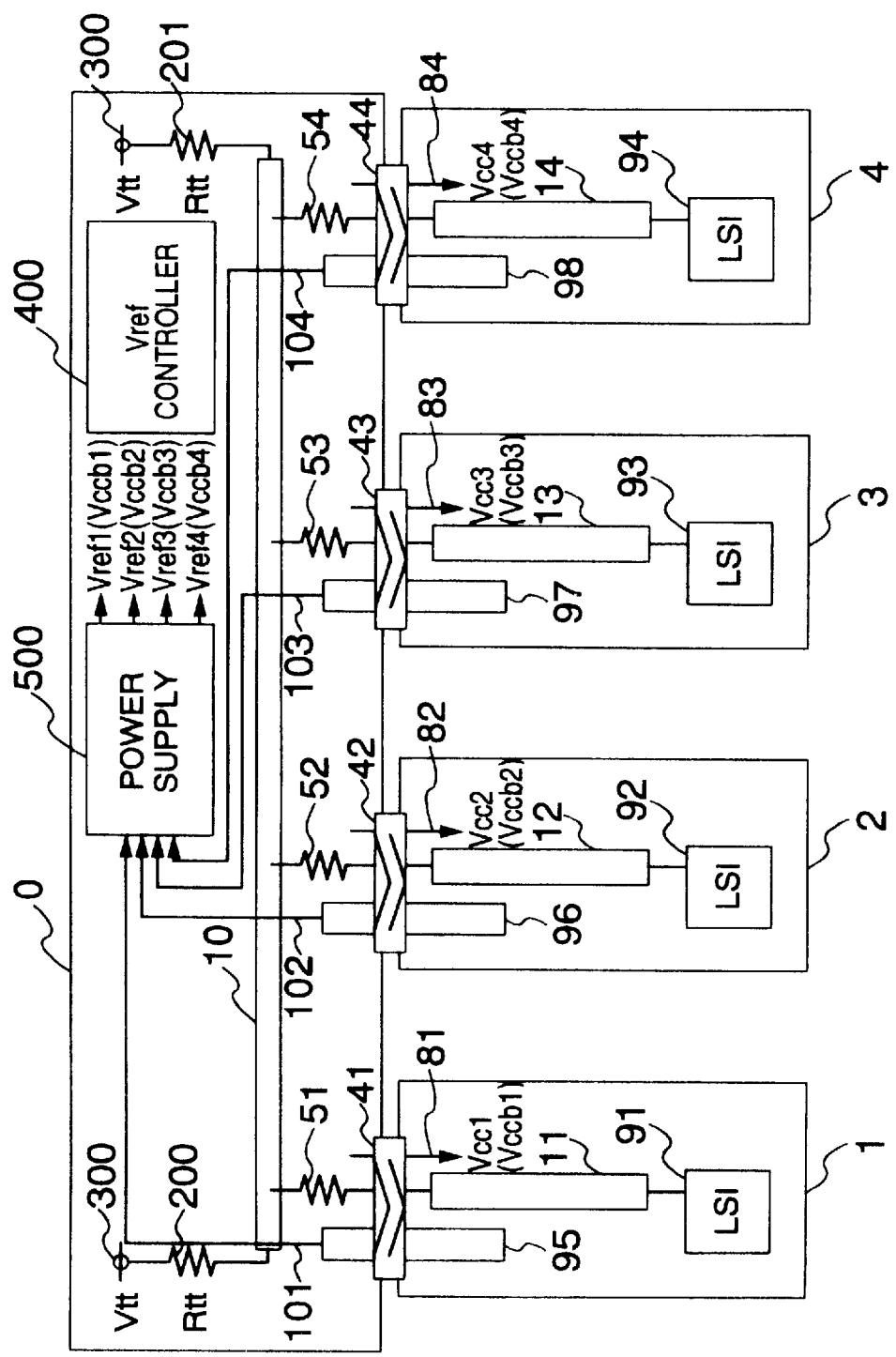
FIG. 15 is a diagram showing an embodiment according to the present invention including modules operating with different power source voltages.

Referring now to FIG. 15, description will be given of another embodiment of the present invention. In this embodiment, the data transfer is accomplished when modules operating with different power source voltages are connected to the bus. The object of the embodiment is that the end user can additionally install a module which has new functions and which operates with a power source voltage and a bus interface other than those of existing modules already being utilized in the user's apparatus.

Each of the connectors 41 to 44 linked with a module to supply power thereto has power supply pins. The same pin positions or numbers are assigned to the connectors 41 to 44. Thanks to this provision, the module can be installed in an arbitrary connector on the bus. To operate a system including modules operating with different kinds of power sources, it is required for pins having the same connector pin numbers to supply supply different voltages, respectively.

Although not specifically shown in FIG. 15, data is transferred through the bus in the same fashion as for the configuration of FIG. 11. The bus interface type is identified by the Vref controller 400 to regulate the termination voltage Vtt and comparator reference voltage Vref.

Modules 1 to 4 each include a plurality of large-scale semiconductor integrated circuits (LSIs) to accomplish data transfer operations via the bus interface circuits. Some of the LSIs are linked with the bus 10. LSIs 91 to 94 are representatively shown in this diagram. The necessary power source voltage varies between the modules 1 to 4, e.g., 5 V and 3.3 V are required depending on cases. Moreover, there may be a case in which a plurality of voltages such as −12 V and +12V are necessary for some modules. In addition, the voltage of circuits related to the bus interface may be different from that required for the other circuits. In FIG. 15, the voltages necessary for the respective module 1 to 4 are respectively indicated as Vcc1 to Vcc4. When the voltages required for the bus interface are to be implicitly expressed, the voltages will be represented as Vccb1 to Vccb4.

In FIG. 15, reference numeral 500 denotes a power source to supply power source voltages Vcc1 to Vcc4 (Vccb1 to Vccb4) to the associated modules 1 to 4. In the modules 1 to 4, numerals 81 to 84 stand for power supply lines to receive power from the power source 500 via connectors 41 to 44, respectively. Numeral 95 to 98 designate module power identification circuits to produce module power identifier signals 100 (101 to 104). Information items of the power source voltages of the respective modules 1 to 4 are respectively sent via the identifier signals 101 to 104 from the modules 1 to 4 to the power source 500.

Figure 16:
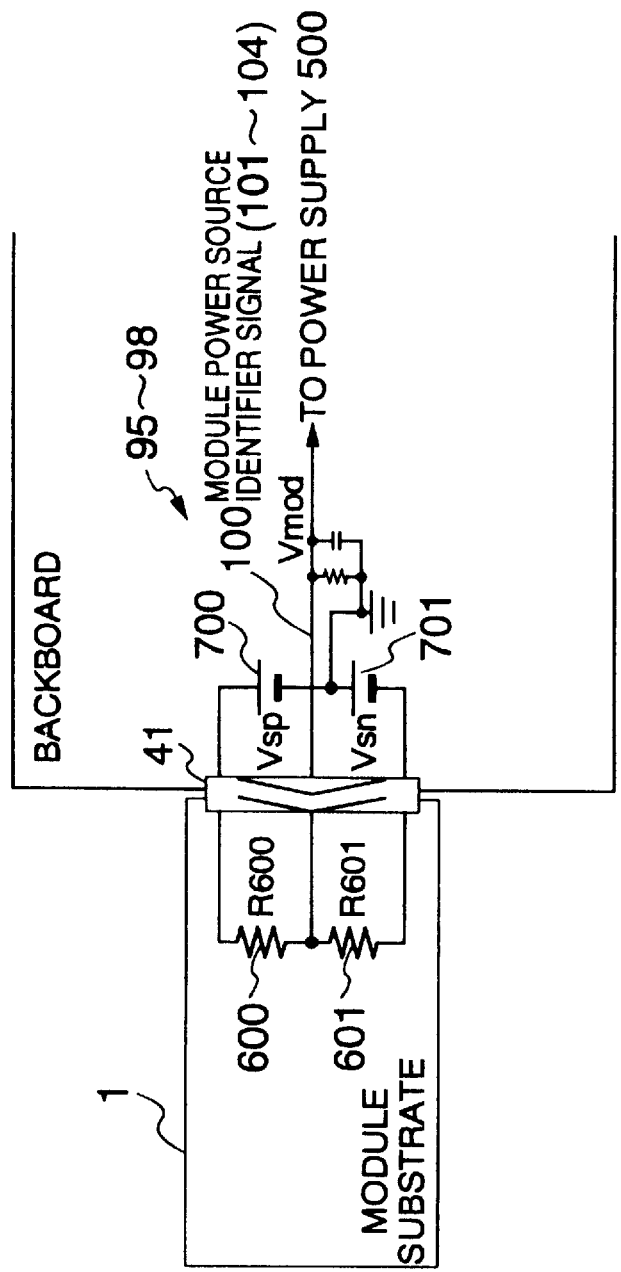
FIG. 16 is a diagram showing an embodiment of the circuit for identifying module power source voltages.

FIG. 16 shows an embodiment of the module power source identification circuit 95 according to the present invention. A positive voltage Vsp 700 and a negative voltage Vsn 701 are applied via the connector 41 to resistors 600 (R600) and 601 (R601), respectively. According to the voltage division ratio, there can be generated a module power source identifier signal Vmod 100, which is represented as follows.

$$Vmod=(R601 \cdot Vsp - R600 \cdot Vsn)/(R600+R601)$$

For example, when the voltages Vsp 700 and Vsn 701 each are 5 V and the associated module requires a voltages of 5V, the identifier signal Vmod 100 is produced as 5 V by setting the resistor 600 (R600) to zero ohm. On receiving the signal Vmod 100, the voltage supply circuit 500 need only supply a voltage of 5 V to the pertinent module.

When the module requires 3.3 V, it is only necessary to set the voltage division ratio of the resistors as R600:R601=(1+ 3.3/5):(1−3.3/5). Moreover, when the module requires a negative voltage, the identifier signal can be attained as a negative voltage by altering the voltage ratio between the registers 600 and 601, thereby transferring the signal 100 to the voltage supply circuit 500.

Next, operation of the circuit 500 will be described with reference to FIG. 17. The power source identifier signals 101 to 104 are delivered to a power source identification circuit 501 in the circuit 500 such that the voltages necessary for the respective modules are recognized by the identification circuit 501 in a method, which will be described later.

Numerals 550 to 552 denote system power supply circuits respectively having different supply voltages. The circuits 550 to 552 supply, for example, voltages 12 V, 5 V, 3.3 V, and −5 V used in ordinary electronic information processing apparatuses. Although only three voltage supply circuits are shown in FIG. 17, the number of voltage supply circuits depends on the system and hence may be equal to or more than three or less than three depending on cases.

Numerals 511 to 514 stands for power switching means of the respective modules. Usually, the means each favorably have a low impedance in the conductive state.

The identification circuit 501 respectively activates the switching means 511 to 514 in response to the signal voltages of the respective identifier signals 101 to 104 such that the output voltages Vcc1 to Vcc4 (Vccb1 to Vccb4) are set to either one of the voltages from the voltage supply circuits 550 to 552 or to the off (GND) state.

The identification circuit 501 checks to decide whether or not each of the identifier signals matches the output voltages from the voltage supply circuits 550 to 552. If the check results in "matching", the identification circuit 501 initiates the pertinent switching means to supply the output voltage from the associated voltage supply circuit.

Figure 17:
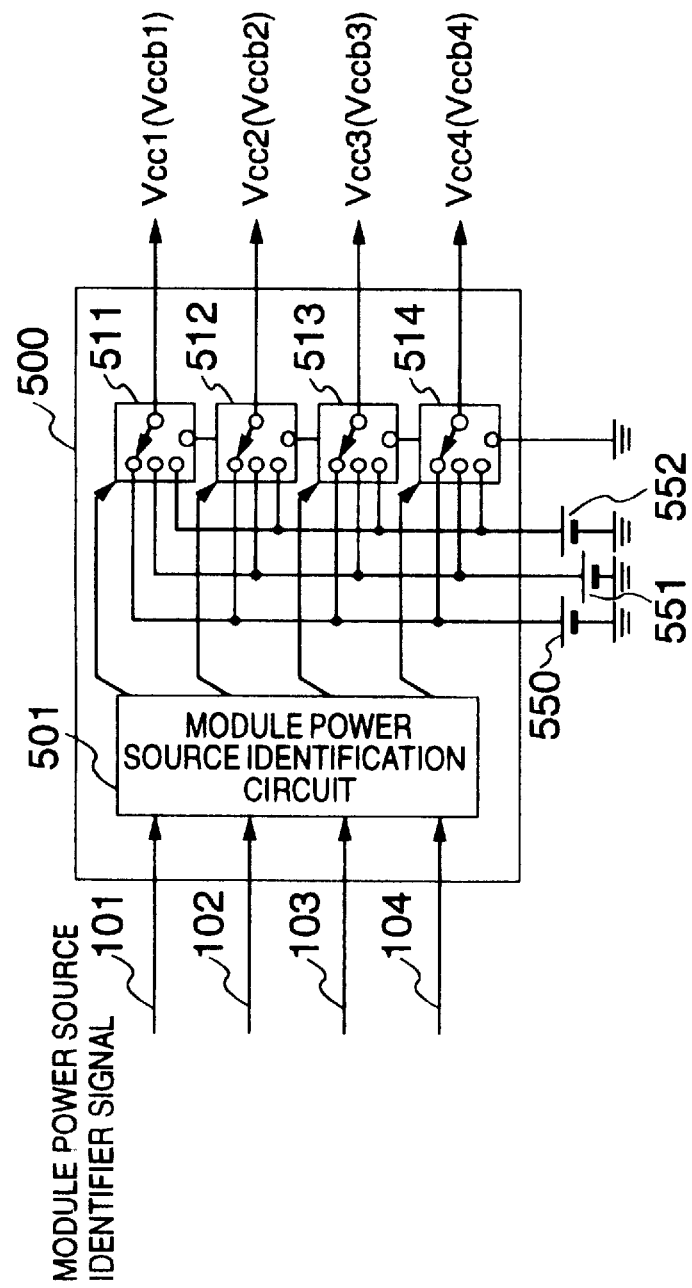
FIG. 17 is a diagram showing an embodiment according to the power supply circuit of FIG. 15.
Figure 18:
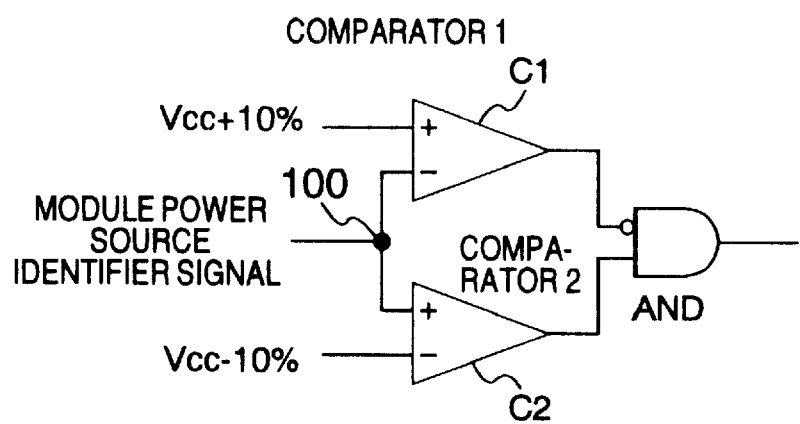
FIG. 18 is a diagram showing an embodiment of the circuit for processing a module power source identifier signal.

The voltage matching state can be determined by the circuit of FIG. 18. In this case, the voltage matching indicates that the module power identifier signal 100 is in a range of Vcc±10%, where Vcc is the supply voltage. Namely, the identification circuit 501 need only identify whether or not the signal 100 is in the range Vcc±10%. Specifically, the voltage Vcc representatively indicates the voltages from the voltage supply circuits 550 to 552 of FIG. 17.

Voltage comparator circuits C1 and C2 compare the module power identifier signal 100 respectively with reference voltages set as Vcc+10% and Vcc−10% and output results of comparisons in the form of logical levels. The outputs from the comparators C1 and C2 are inputted to an AND gate circuit to produce a logical product thereof. When the ANDed result is an H-level signal, the module power identifier signal 100 is assumed to be in the range Vcc±10%. Otherwise, the signal 100 is determined to be beyond the range. In this manner, the identification circuit 510 identifies the voltage matching condition between the module power identifier signal 100 and the supply voltage Vcc.

The identification circuit 501 of FIG. 17 includes the voltage matching circuit of FIG. 18 for each of the identifier signals 101 to 104 in relation to the voltage supply circuit 550 to 552. According to the output from the voltage matching circuit, it is determined to which one of the voltage supply circuits 550 to 552 the pertinent identifier signal corresponds. When the module power identifier signal 100 from a module does not match any one of the voltages from the supply circuits 550 to 552, the identification circuit 501 sets the related one of the switching means 511 to 514 to the ground potential (GND), thereby outputting the GND signal. In this case, the module is separated from the system, i.e., the functions thereof cannot be used. This event takes place because that the voltage necessary for the module is other than the voltages supplied from the system. Electrically separating the module from the system leads to an advantage of prevention of such events which may possibly occur when the module is powered as the increase in overvoltage due to the impedance difference and troubles associated therewith including undesired production of heat, emission of smoke, and burning of parts of the apparatus.

Furthermore, the identification circuit 501 may identify the signal as follows. The signal is transformed by an analog-to-digital converter (ADC) into a digital quantity to directly measure a voltage of the signal. According to the digital quantity, the switching means 511 to 514 are controlled to appropriately select the voltage supply circuits 550, 551, or 552.

Figure 19:
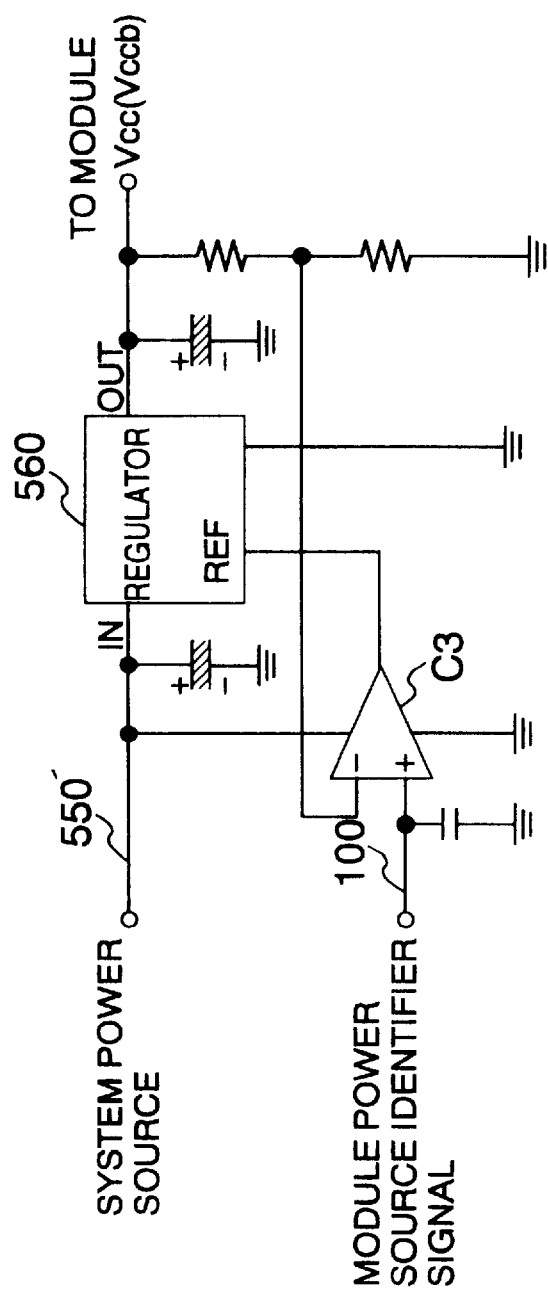
FIG. 19 is a diagram showing an embodiment of the circuit for supplying power to a module.

FIG. 19 shows another example of the voltage generator circuit of each module in the power source circuit 500. This diagram shows a portion of the voltage generator for one module, namely, the system includes the circuit of FIG. 19 as many as there are modules.

In FIG. 19, numeral 550' indicates a system power supply of the system. Numeral 560 stands for a voltage regulator which is a regulated power source circuit to control an output voltage therefrom. Specifically, on receiving a signal from an input terminal IN, the regulator 560 conducts a control operation to set the voltage on a reference voltage terminal REF and that of an output terminal OUT to be equal to each other. C3 indicates an operational amplifier configured in a feedback circuit. Namely, the voltage of the module power identifier signal 100 is compared with the output voltage from the regulator 560. When the voltage from the regulator 560 is larger, the REF signal voltage from the regulator 560 is reduced to resultantly lower the output voltage from the regulator 560. Therefore, the voltage of the module power identifier signal 100 becomes equal to the output voltage from the regulator 560. In this regard, although the module power identifier signal 100 may be directly fed to the REF terminal of the regulator 560 by skipping the operational amplifier C3, there may flow a small leakage current depending on characteristics of the regulator 560, leading to a voltage drop in the voltage of the module power identifier signal 100 in some cases. Consequently, the provision of the operational amplifier C3 leads to an advantageous effect that the voltage drop in the module power identifier signal 100 is reduced due to the leakage current.

As above, the power source circuit 500 configured as shown in FIG. 17 or 19 can produce the supply voltages required for the respective modules.

Arranging the voltage supply circuit 500, module power identification circuits 95 to 98 and, an module power identifier signals 101 to 104 as described above, the required voltages can be supplied from the pins at the same positions of the connectors to the respective modules. In addition, thanks to the Vref controller and matching resistors, there can be attained the bus interface compatibility and the data transfer can be conducted at a high speed with reduced waveform distortion.

To achieve the same functional object, there may be adopted, in addition to the configurations described above, a construction in which all power sources necessary for the modules are assigned to the same pin positions of the connectors 41 to 44 such that the necessary voltages are supplied through the pins to the respective modules.

Although four modules are connected to the bus in the drawings related to the description of the above embodiments, the number of modules is not limited to four. Namely, in general, the number may be equal to or more than four or less than four. Furthermore, each module may includes a driver and a receiver. However, it is also possible that the module includes only the driver or receiver. Additionally, the bus interface may be fabricated in the logical LSI chip or may be separated therefrom. This applies to the embodiments and any modifications of the present invention.

In this connection, if the matching resistors 51 to 54 are missing in FIG. 15, there can be implemented a bus interface, at least, between modules having different power source voltages, respectively.

Figure 20:
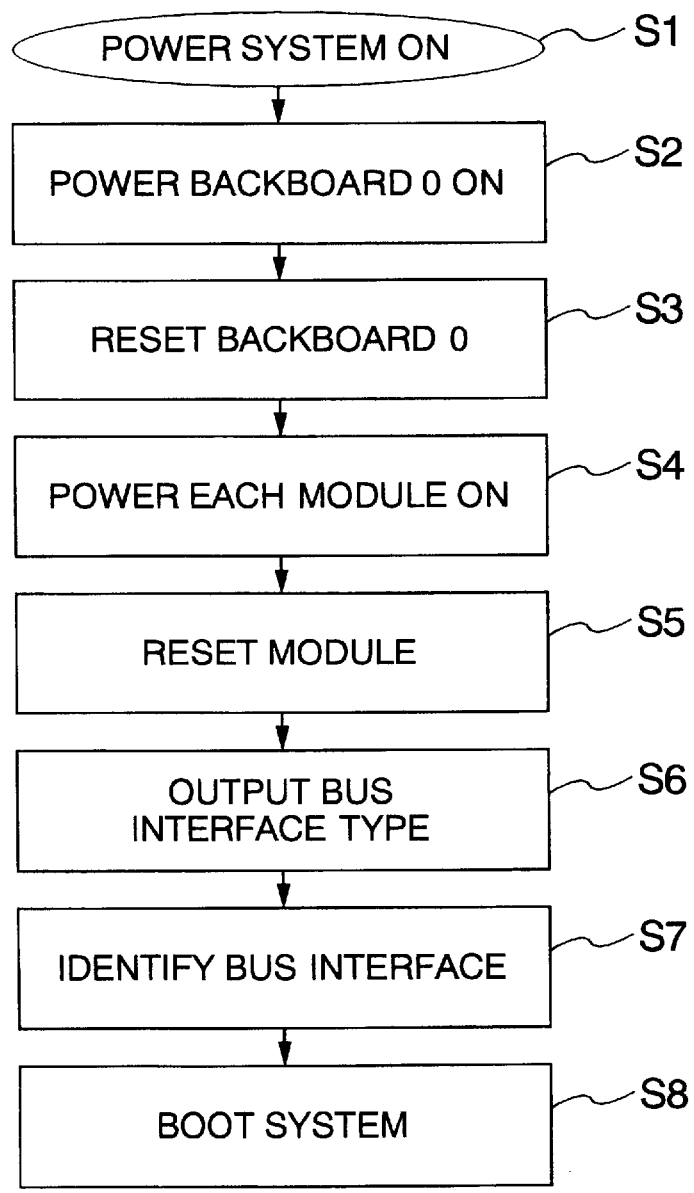
FIG. 20 is a flowchart showing an operation sequence to power the system according to the present invention.

Referring now to FIG. 20, description will be given of the system initiation sequence of the embodiments above. The sequence is controlled by a central processing unit (CPU) or hardware system.

Sequence S1: Power on

After the constituent elements of the system including the functional circuit modules and peripheral circuits are connected to each other, the user or manager of the system powers the system.

Sequence S2: Power backboard 0

The system then turns backboard 0 on. The respective modules 1 to 4 are not powered in this situation. When backboard 0 is thus powered, the module power identifier signal 100 is created as described with reference to FIG. 16. Namely, the voltages necessary for the respective modules are produced by the resistors 600 and 601 and the power sources 700 and 701 on backboard 0 shown in FIG. 16. For any one of the connectors 44 to 44 in which a module is not installed, the associated module power identifier signal 101, 102, 103, and 104 are set to 0 V. Namely, the connector is resultantly not applied with any voltage, which will be described later.

Sequence S3: Reset backboard 0

When the voltage applied to backboard 0 is stabilized, the circuits therein are reset. Sequence S3 includes the operation to reset the power supply circuit 500 and Vref controller 400 of FIGS. 11 and 15.

Sequence S4: Power each module

When the modules are installed in the connectors in FIG. 15, the power supply circuit 500 delivers the necessary voltages via the power lines 81 to 84 to the respective modules. When the module is missing in any one of the connectors 41 to 44, the related module power identifier signals 101–104 are set to 0 V. As a result, the connector is not applied with the voltage from the power source 500.

When the modules 1 to 4 require mutually different power source voltages Vcc1 to Vcc4, the power supply 500 supplies the modules 1 to 4 with voltages associated with the module power identifier signals 101 to 104, respectively.

Sequence S5: Reset module

In the module powered, the internal circuits thereof are reset. This operation may be carried out by backboard 0 or by a reset signal generator arranged in the module.

Sequence S6: Produce bus interface type signal

The modules 1 to 4 linked with the connectors in FIG. 11, 13, or 15 generate interface identifier signals 71 to 74 designating the open-drain bus interface of the GTL module, push-pull bus interface of the CTT, or bus interface interface having matching resistors like in the case of the SSTL interface.

The interface identifier signals 71 to 74 are allocated to particular pins of the respective connectors 41 to 44. To obtain particular signal patterns respectively in the modules 1 to 4, the signals 71 to 74 may be generated by the pull-up or pull-down operation or may be obtained by reading by a separated low-speed serial bus the contents of registers which indicate interface types and which are disposed in the modules, respectively.

Sequence S7: Identify bus interface

The Vref control circuit 400 then outputs bus interface reference voltages Vref to the modules 1 to 4 respectively according to the interface identifier signals 71 to 74. The Vref controller 400 simultaneously output terminal voltages Vtt in conformity with the respective bus interfaces.

In this connection, the reference voltages Vref1 to Vref4 and the termination voltage Vtt take different values depending on the number and types of bus interfaces.

Additionally, the system booting process is kept in the wait state during the above operation. Namely, after sequence S7 is completely finished, the system is booted. This can be simply achieved by continuously resetting the circuits other than those related to sequence S7 and power supply operation.

Subsequently, operation of the Vref controller 400 will be described by referring to the example shown in FIG. 13.

(1) Operation with only one bus interface type

When the installed modules have only one interface type, i.e., the GTL or CTT interface, the Vref controller 400 turns the switching elements 801 to 804 off and then sets the termination voltage Vtt to half that of Vccb supplied to the bus driver of the pertinent module. The Vref controller 400 supplies the reference voltage Vref according to expression (6) for the GTL modules and according to Vref=Vtt for the CTT modules.

When the modules have the SSTL interface using matching resistors, the Vref controller 400 turns the switching elements 801 to 804 on and then keeps the conductive state thereof. The Vref controller 400 supplies the termination voltage Vtt equal to half the voltage Vccb fed to the pertinent module. The Vref controller 400 sets the reference voltage Vref according to Vref=Vtt.

(2) Operation with two bus interface types including GTL and CTT interfaces

The Vref controller 400 supplies the modules 2 of the GTL interface with the reference voltage Vref2 according to expression (7) and modules of the CTT interface with the reference voltage Vref2 according to expression (10). The Vref controller 400 keeps the switching elements 801 to 804 remained in the non-conductive state.

The Vref controller 400 supervises Vtt to be equal to the CTT interface voltage Vccb.

(3) Operation with two bus interface types including GTL and SSTL interfaces

The Vref controller 400 supplies the module 2 of the GTL interface with the reference voltage Vref2 according to expression (7). The Vref controller 400 supplies the module 1 of the SSTL interface with the reference voltage Vref according to expression (7) as described in (2) above and then turns the switching element 801 on. The Vref controller 400 keeps the other switching elements 802 to 804 retained in the non-conductive state.

The Vref controller 400 sets Vtt to be equal to the CTT interface voltage Vccb.

When two or more modules operate with the SSTL interface, the Vref controller 400 similarly turns only the switching elements corresponding the SSTL interface modules. Resultantly, the matching resistance values are equalized for the modules having the respective matching resistors and hence a high-speed data transfer can be performed with reduced waveform distortion.

(4) Operation with two bus interface types including CTT and SSTL interfaces

For the SSTL interface module 1 having the matching resistor 510, the Vref controller 400 turns the switching element 801 thereof on. The Vref controller 400 keeps the other switching elements 802 to 804 retained in the non-conductive state. Moreover, when the same voltages Vccb1 to Vccb4 are supplied to the bus drivers of the respective modules 1 to 4, the Vref controller 400 sets the termination voltage Vtt to half the voltage Vccb. The Vref controller 400 controls the reference voltages Vref1 to Vref4 to be equal to Vtt.

However, when the bus drivers of the respective modules 1 to 4 are supplied with mutually different voltages Vccb1 to Vccb4, the Vref controller 400 sets the termination voltage Vtt to half the highest supply voltage. The Vref controller 400 supervises the reference voltages Vref1 to Vref4 to be equal to Vtt.

(5) Operation with three bus interface types including CTT, GTL, and SSTL interfaces For the SSTL interface module 1 having the matching resistor 510, the Vref controller 400 turns the switching element 801 thereof on. The Vref controller 400 keeps the other switching elements 802 to 804 remained in the non-conductive state. Moreover, when the same voltages Vccb1 to Vccb4 are supplied to the bus drivers of the respective modules 1 to 4, the Vref controller 400 sets the value of termination voltage Vtt to that of Vccb. In this situation, the Vref controller 400 controls the reference voltages Vref1 to Vref4 according to expression (6) for the GTL interface module and according to expression (10) for the CTT or SSTL interface. Additionally, when the bus drivers of the respective modules 1 to 4 are supplied with mutually different voltages Vccb1 to Vccb4, the Vref controller 400 sets the termination voltage Vtt to the highest supply voltage. The Vref controller 400 regulates the reference voltages Vref1 to Vref4 according to expression (6) for the GTL interface module and according to expression (10) for the CTT or SSTL interface module.

Sequence S8: System boot

Since the data transfer can be conducted between the modules via the bus, the system releases the reset state and then achieves the system booting operation.

The system is thus booted to be initiated in a stable state and the data can be consequently transferred with a high reliability between the modules having mutually different bus interfaces.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:
1. An information processing apparatus including:
   a backboard having a bus for transmitting signals therethrough;
   at least one module having a signal transmitting means for transmitting signals to the bus or signal receiving means for receiving signals therefrom;
   a connector to the connect the bus to the module, wherein the backboard includes:
      two terminators disposed respectively at both ends of the bus for providing matched termination according to a characteristic impedance of the bus to which the module is connected; and
      a first matching resistor disposed between the bus and the module in a serial connection, wherein the first matching resistor has a resistance value Rm satisfying

$$Rm = Z1 \cdot k - Z0/2 \, (0.8 < k < 1.3)$$

where, Z1 indicates a characteristic impedance of the module, Z0 denotes the characteristic impedance of the bus, and k stands for a coefficient.

2. An information processing apparatus according to claim 1, wherein:
   the signal transmitting means includes an open-drain or open-collector driver;
   the signal receiving means includes a voltage-comparator receiver; and
   the backboard includes means for setting $$Vref = (V_{KH} + V_{KL})/2$$

where, Vref denotes a reference voltage of the voltage-comparator receiver and $V_{KH}$ and $V_{KL}$ respectively indicate an H level and an L level of signals received by the module.

3. An information processing apparatus according to claim 1, wherein:
   the signal transmitting means includes a push-pull driver;
   the signal receiving means includes a voltage-comparator receiver; and
   the backboard includes means for setting $$Vref = (V_{KH} + V_{KL})/2$$

where, Vref denotes a reference voltage of the voltage-comparator receiver and $V_{KH}$ and $V_{KL}$ respectively indicate an H level and an L level of signals received by the module.

4. An information processing apparatus according to claim 1, wherein:
   the module further includes means for generating a bus interface identifier signal indicating a type of the driver thereof; and
   the backboard includes reference voltage control means for controlling according to the interface identifier signal a signal judge reference voltage Vref to be supplied to the module.

5. An information processing apparatus according to claim 4, wherein the reference voltage control means includes means for setting, when the interface identifier signal indicates a an open-drain, open-collector, or push-pull driver, the reference voltage Vref as $$Vref = (V_{KH} + V_{KL})/2$$

where, $V_{KH}$ and $V_{KL}$ respectively indicate an H level and an L level of signals received by the module.

6. An information processing apparatus according to claim 1, further including module power source identifying means for identifying a type of a power source voltage of a module,
   the backboard including power supply means for controlling, according to a result of power source identification from the module power source identifying means, the power source voltage to be supplied to the module.

7. An information processing apparatus according to claim 4, further including module power source identifying means for identifying a type of a power source voltage of a module,
   the backboard including power supply means for controlling, according to a result of power source identification from the module power source identifying means, the power source voltage to be supplied to the module.

8. An information processing apparatus according to claim 4, including the modules which are two or more in number, wherein:
   the signal transmitting means of at least one of the modules includes an open-drain or open-collector driver;
   the signal transmitting means of at least one of the modules includes a push-pull driver;
   each of the plural signal receiving means includes a voltage-comparator receiver; and
   the backboard includes
      means for setting a termination voltage of the bus to be substantially equal to a voltage supplied to the push-pull driver and
      means for setting $$Vref = (V_{KH} + V_{KL})/2$$

where, Vref denotes a reference voltage of the voltage-comparator receiver and $V_{KH}$ and $V_{KL}$ respectively indicate an H level and an L level of signals received by each of the modules.

9. An information processing apparatus according to claim 1, wherein the backboard further includes:
   switching means for establishing a short-circuit to the first matching resistor; and
   means for controlling the switching means based on characteristics of the module.

10. An information processing apparatus according to claim 9, wherein at least one of the modules includes a second matching resistor for matching the characteristic impedance of the module.

11. A bus system, comprising:
   a plurality of bus interfaces, each thereof including an open-drain or open-collector driver;
   a bus including bus wirings for connections to the plural bus interfaces and terminators for providing matched termination at both ends of each of the bus wirings; and
   a matching resistor disposed between the bus wiring and a stub wiring provided between the bus wiring and the bus interface, the matching resistor having a resistance value Rm satisfying $$Rm = Z1 \cdot k - Z0/2 \, (0.8 < k < 1.3)$$

where, Z1 indicates an impedance value of the stub wiring, Z0 denotes a characteristic impedance of the bus wiring, and k stands for a coefficient.

12. A backboard comprising:

a bus for transmitting signals therethrough;

at least one connector connected to the bus for connecting at least one module to the bus, the module transmitting and/or receiving signal to and/or from the bus when necessary;

two terminators disposed respectively at both ends of the bus for providing matched termination according to a characteristic impedance of the bus connected to the module; and a matching resistor disposed between the bus and the connector for matching a characteristic impedance of the module, wherein the matching resistor has a resistance value Rm satisfying $$Rm = Z1 \cdot k - Z0/2 \, (0.8 < k < 1.3)$$

where, Z1 indicates a characteristic impedance of the module, Z0 denotes the characteristic impedance of the bus, and k stands for a coefficient.

13. An information processing apparatus in which a plurality of modules having different power source voltages are connected to a bus disposed on a backboard to conduct data transmission and reception via the bus, comprising:

module power source identifier signal generator means for generating a module power source identifier signal corresponding to a power source voltage of each of the modules; and power supply means for controlling, according to the module power source identifier signal, the power source voltage to be supplied to the module.

14. An information processing apparatus according to claim 13, wherein:

the modules each include signal transmitting means for transmitting signals to the bus or signal receiving means for receiving signals therefrom;

at least one of the signal transmitting means includes an open-drain or open-collector driver;

at least one of the signal transmitting means includes a push-pull driver;

each of the signal receiving means includes a voltage-comparator receiver; and the backboard includes means for setting a termination voltage of the bus to be substantially equal to a voltage supplied to the push-pull driver and means for setting $$Vref = (V_{KH} + V_{KL})/2$$

where, Vref denotes a reference voltage of the voltage-comparator receiver and $V_{KH}$ and $V_{KL}$ respectively indicate an H level and an L level of signals received by each of the modules.

15. A boot control method for use in an information processing apparatus in which a plurality of modules are connected to a bus disposed on a backboard to conduct data transmission and reception via the bus, comprising the steps of:

supplying power to the backboard;

supplying power source voltages respectively to the modules connected to the backboard;

identifying a type of a bus interface of each of the modules and generating a bus interface identifier signal; and producing, according to the bus interface identifier signal, a reference voltage Vref for the bus interface of the module and a termination voltage Vtt of the bus corresponding to the bus interface.

16. A boot control method according to claim 15, wherein the step of producing the bus interface reference voltage Vref includes a step of setting $$Vref = (V_{KH} + V_{KL})/2$$

where, $V_{KH}$ and $V_{KL}$ respectively indicate an H level and an L level of signals received by each of the modules.

17. A boot control method according to claim 15, wherein the step of producing the termination voltage Vtt includes a step of setting, when the voltages supplied to bus drivers of the respective modules are different from each other, the termination voltage Vtt to be substantially equal to a highest value of the supplied voltages.

18. A boot control method according to claim 15, wherein the step of supplying power source voltage to the modules includes the steps of:

identifying a type of the power source voltage of the module; and generating the power source voltages of the module according to a result of the identification of the power source type.

* * * * *